(12) United States Patent
Kremin et al.

(10) Patent No.: US 11,768,564 B2
(45) Date of Patent: Sep. 26, 2023

(54) LOW-NOISE, HIGH-RESOLUTION RATIOMETRIC CAPACITIVE BASELINER

(71) Applicant: Cypress Semiconductor Corporation, San Jose, CA (US)

(72) Inventors: Viktor Kremin, Lviv (UA); Oleksandr Pirogov, Lviv (UA); Vadym Grygorenko, Lviv (UA); Jens Weber, Munich (DE)

(73) Assignee: Cypress Semiconductor Corporation, San Jose, CA (US)

( * ) Notice: Subject to any disclaimer, the term of this patent is extended or adjusted under 35 U.S.C. 154(b) by 203 days.

(21) Appl. No.: 17/202,862

(22) Filed: Mar. 16, 2021

(65) Prior Publication Data

US 2021/0373683 A1 Dec. 2, 2021

Related U.S. Application Data

(60) Provisional application No. 63/033,591, filed on Jun. 2, 2020, provisional application No. 63/006,275, filed on Apr. 7, 2020.

(51) Int. Cl.
*G06F 3/044* (2006.01)
*G01R 27/26* (2006.01)
(Continued)

(52) U.S. Cl.
CPC ......... *G06F 3/044* (2013.01); *G01R 27/2605* (2013.01); *G06F 3/0418* (2013.01);
(Continued)

(58) Field of Classification Search
CPC ........... G06F 3/044; G06F 2203/04108; G06F 3/04166; G06F 3/0418; G01R 27/2605;
(Continued)

(56) References Cited

U.S. PATENT DOCUMENTS 8,446,158 B1 5/2013 Jansson
2008/0111714 A1 5/2008 Kremin
(Continued)

OTHER PUBLICATIONS

Patent Cooperation Treaty, Written Opinion of the International Searching Authority—PCT/US2021/026048, dated Aug. 25, 2021; 9 pages.

(Continued)

*Primary Examiner* — Amy He

(57) ABSTRACT

An apparatus includes a global baseliner circuit coupled with sensing channels of a sensing device. The global baseliner circuit has a signal generator to generate a rectified sinusoidal signal and a square wave having a frequency matching that of an excitation sinusoidal signal, and is to use the square wave to modulate the excitation sinusoidal signal provided at an output of the global baseliner circuit. A channel baseliner circuit is coupled between the global baseliner circuit and a sensing channel and that includes a switched capacitor coupled between the output of the global baseliner circuit and the sensing channel; a sigma-delta modulator coupled with the signal generator and to generate, from the rectified sinusoidal signal, a density-modulated bit stream; and a pair of AND gates to use the density-modulated bit stream and non-overlapping clock signals to generate outputs including density-modulated clock signals sent to switches of the switched capacitor.

20 Claims, 18 Drawing Sheets

(51) Int. Cl.
*H03K 17/96* (2006.01)
*H03M 3/00* (2006.01)
*G06F 3/041* (2006.01)

(52) U.S. Cl.
CPC ....... *G06F 3/04166* (2019.05); *H03K 17/962* (2013.01); *H03M 3/39* (2013.01); *G06F 2203/04108* (2013.01); *H03K 2217/96074* (2013.01)

(58) Field of Classification Search
CPC ...... H03K 17/962; H03K 2217/96074; H03M 3/39
See application file for complete search history.

(56) References Cited

U.S. PATENT DOCUMENTS

| | | |
|---|---|---|
| 2016/0026295 A1* | 1/2016 | Ogirko ................ G06F 3/04166 345/174 |
| 2017/0061188 A1 | 3/2017 | Kremin et al. |
| 2017/0371451 A1* | 12/2017 | Ellis .................... G06F 3/04166 |
| 2018/0284928 A1 | 10/2018 | Kremin |
| 2018/0300013 A1 | 10/2018 | Yang et al. |
| 2019/0079634 A1 | 3/2019 | Kravets et al. |

OTHER PUBLICATIONS

Patent Cooperation Treaty, International Search Report, PCT/US2021/026048, dated Aug. 25, 2021; 5 pages.

\* cited by examiner

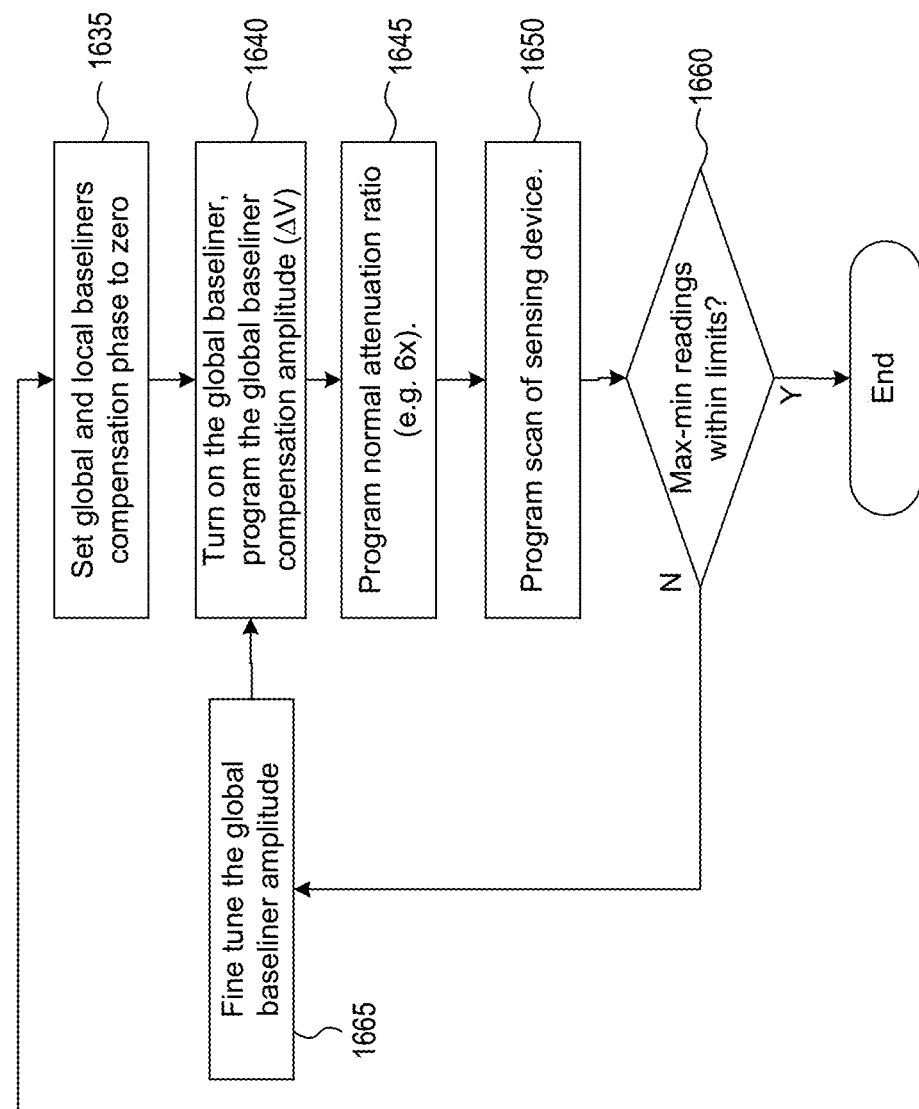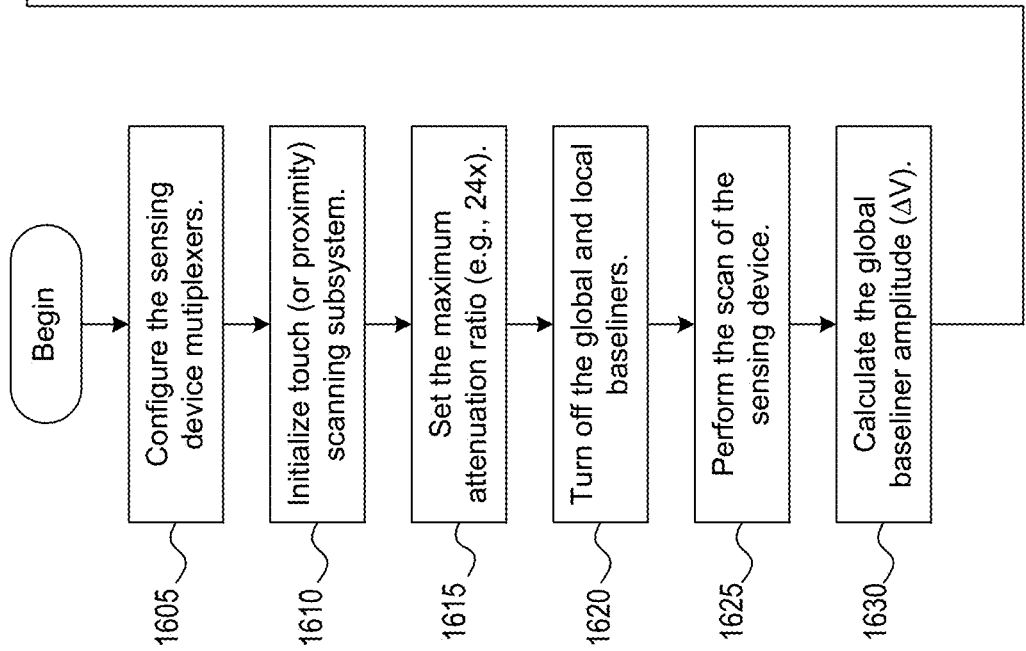
FIG. 16

LOW-NOISE, HIGH-RESOLUTION RATIOMETRIC CAPACITIVE BASELINER

RELATED APPLICATIONS

This application claims the benefit of priority to U.S. Provisional Patent Application No. 63/006,275, filed Apr. 7, 2020, and U.S. Provisional Patent Application No. 63/033,591, filed Jun. 2, 2020, which are herein incorporated by these references in their entireties.

BACKGROUND

Devices and systems, such as mobile communications devices, can include various sensing devices such as touchscreens (e.g., touch panels) and buttons. The touchscreens and buttons can utilize one or more sensing modalities to receive the inputs from an entity, such as from a user of a mobile communications device. An example of such a modality can include capacitive (or other) sensing in which a touchscreen or button can include conductive elements, which can be used to obtain measures of various capacitance (or other parameters).

For example, a touch panel can include an array of electrodes and a touchscreen controller can be used to measure capacitances (or other phenomena) associated with those electrodes. However, some touch panels have increased in size, causing parasitic capacitance or other parasitic noise to drown out the small change in capacitance (or other phenomena) that is to be sensed.

BRIEF DESCRIPTION OF THE DRAWINGS

The disclosure is illustrated by way of example, and not of limitation, in the figures of the accompanying drawings.

FIG. 16 is a flow diagram of a method for performing calibration of the global baseliner circuits disclosed herein according to various embodiments.

DETAILED DESCRIPTION

Figure 1:
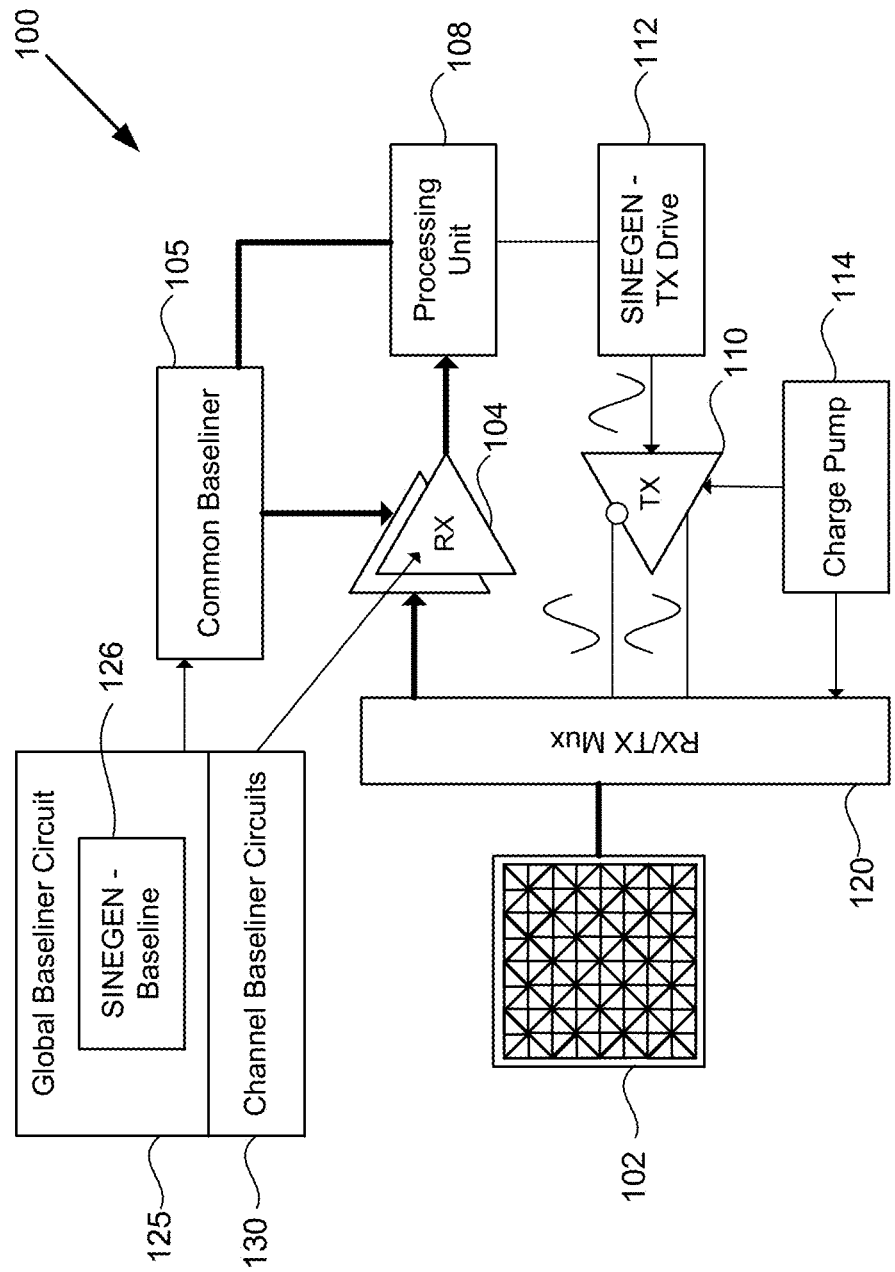
FIG. 1 is a schematic block diagram of a sensing device such as a touch panel system that employs a low-noise, high-resolution baseliner according to various embodiments.

The following description sets forth numerous specific details such as examples of specific systems, components, methods, and so forth, in order to provide a good understanding of various embodiments of the techniques described herein for a low-noise, high-resolution capacitive baseliner. It will be apparent to one skilled in the art, however, that at least some embodiments can be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations can vary from these exemplary details and still be contemplated to be within the scope of the present disclosure.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the disclosure. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which can also be referred to herein as "examples," are described in enough detail to enable those skilled in the art to practice the embodiments of the claimed subject matter described herein.

The embodiments can be combined, other embodiments can be utilized, or structural, logical, and electrical changes can be made without departing from the scope and spirit of the claimed subject matter. It should be understood that the embodiments described herein are not intended to limit the scope of the subject matter but rather to enable one skilled in the art to practice, make, and/or use the subject matter.

Described herein are various embodiments of techniques for injecting a compensation current into sensing channels to eliminate parasitic capacitance, inductance, impedance, resistance, or other such electrical noise that exists between mutually coupled sensing electrodes. While the present embodiments are applied more specifically to vehicle touch screens by way of example, they are applicable to a wide range of applications where there is a need to measure a small capacitance or other physical parameter change in the presence of other large non-informative component(s) that can be removed. In addition to touch panels generally, the present embodiments are also applicable to water level sensors, capacitive position sensors, proximity sensors, fuel level meters, inductive sensors, and the like. In various embodiments, the disclosure is designed to work with sensors that use sinusoidal excitation signals to keep overall sensor emissions low, however, the disclosure can be adapted for use with other operation waveforms.

In some embodiments, modern cars use long and narrow (up to 35") displays for infotainment and dashboard. Touch controllers are required to recognize small touch signals, e.g., ~0.1 picofarad (pF) in self-capacitance mode, under large parasitic capacitance, e.g., ~100+/−250 pF/line. To do so, a sensing device measures self and mutual capacitances of the sensing electrodes. In one embodiment, a shield-less, large-panel hover and touch controller may need to sense small capacitance changes, e.g., ~10+/−20 femtofarads (ff), in the presence of large parasitic capacitance ranging from ~20+/−30 pF. The capacitance is subject to large temperature drifts (e.g., between approximately 50-100 fF/° C.), so the baseliner circuit tracks such capacitance with sufficient resolution and seeks to prevent the sensing channel from saturating. Thus, a low-noise, high-resolution baseliner is configured that is capable of such high-sensitivity sensing.

To recognize small touch signals and perform reliable touch detection under various environmental conditions (e.g. wet, water films, water droplets), sensing circuits can be adapted to focus on measuring both the electrode self-capacitance (capacitance between sensor and ground) and mutual capacitances between transmit (TX) and receive (RX) electrodes. For properly designed touch panels and flex cable, the parasitic capacitance mismatch between individual sensing electrodes can range between 8-10%. Parasitic capacitance for sensor lines increases with an increase in screen size. Other parasitic effects in other electrical parameters also contribute to noise (like LCD noise) and sensing problems. Most of the sensing-channel dynamic range is wasted by the non-informative base capacitance level.

In various embodiments, a baseliner can generate an opposite sign compensation current to reduce the impact of parasitic capacitance, which helps to free the sensing channel dynamic range for useful touch signal sensing. Ideally, the compensation current follows the same waveform as the sensing channel current to reduce the channel peak current and prevent short-time analog saturation. High-resolution capacitance-to-code (CDC) converters are area-expensive and power-expensive, especially when used to provide readings for short conversion cycles, e.g., less than 100 microseconds (µs) in typical applications. These implementations often use bulky circuits with high oversample ratios or fast and high-resolution converters. Further, certain baseliner circuits employed can use continuous current sources that are noisy, primarily due to the low-frequency noise (e.g., flicker noise) in the current references that are generally inversely proportional to frequency. Finally, within differential sensing channels, it is complicated to detect touch and hover and to employ position calculation algorithms. These sensing channels can fail to cover the boundary or special use cases, such as when dealing with a large detection object, for example, with palm rejection.

To address these deficiencies in the art and others that will be discussed, the present disclosure describes a ratiometric switching-capacitor baseliner circuit that includes two stages, e.g., a two-baseliner circuit, to achieve a low-noise, high-resolution baseliner. Ratiometric is used to describe an output signal that changes in proportion to a change in reference input or supply voltage. For example, the excitation source and baseliner might use a common reference source, helping reduce impact of the reference source variations on the CDC output readings. In various embodiments, a first stage is a common global baseliner to compensate the common component in parasitic capacitance across the sensing device and a second stage is a high-resolution channel baseliner to compensate for the parasitic capacitance mismatch between individual sensing electrodes.

In these embodiments, the two-baseliner circuit and transmitter (TX) signal generator share a common supply voltage, so the compensation charge is proportional to the TX signal level, achieving the ratiometric operation. The two-baseliner circuit does not use continuous current sources that are noisy and might substantially degrade the sensing performance. In some embodiments, the two-baseliner circuit employs at least one sigma-delta modulator and optionally two sigma-delta modulators. For example, a common sigma-delta modulator can be employed for all channels within the global baseliner circuit that resembles a sense-signal sinusoidal waveform. Further, a sigma-delta modulator can be employed in each channel baseliner circuit to finely tune the compensation charge and resembles a sign alternated rectangular waveform in most embodiments. Due to the high-compensation charge resolution, the baseline tracking can be moved from the firmware to the hardware at the baseliner side, reducing the computation and memory requirements of the firmware. The two-baseliner (e.g., switched capacitor compensation) circuit can further operate at high frequencies (e.g., 24 megahertz (MHz) or higher sample frequency) to use a small value and small-area switched capacitors. In some embodiments, the excitation/transmission frequency might be set to 100 kHz or similar frequency, so the switching capacitor baseliner can operate at the high oversample ratio.

Therefore, advantages of the systems and methods implemented in accordance with some embodiments of the present disclosure include, but are not limited to, providing a fully ratiometric operation that reduces noise added by a baseliner circuit due to the uncorrelated fluctuations between excitation signal and the baseliner compensation current, e.g., due to the power supply voltage change. Further, the compensation current waveform is mirrored from the excitation waveform to reduce the chances of a short-term channel analog saturation and keep a sufficient margin for handling external sensing device or charger noise events. Additionally, a compensation adjustment resolution can be set proportional to the parasitic capacitance (or other electrical parameters), as the capacitance temperature drift is proportional to the remaining parasitic capacitance.

Further, in disclosed embodiments, the two-baseliner circuit can provide a high resolution (e.g., 5 +/−10 femtofarads (fF)) to enable moving some of the baseliner compensation firmware into hardware, to enable fine-tuning the compensation current (e.g., specific to individual sensing channels). Specifically, the use of a global baseliner circuit can achieve gross compensation, and then the use of a channel baseliner enables achieving channel-specific compensation current tuning.

Further, independently generated compensation charge versus the sensing channel input voltage provides efficient work in the single electrode, self-capacitance sinusoidal (SE-SC-SINE) operational mode. Additionally, the disclosed embodiments support the mutual capacitance sinusoidal (MC-SINE) operational mode (e.g., mutual capacitance between sensing electrodes) in addition to the SE-SC-SINE sensing mode to work with larger sum multiphase sequences to reach the best noise suppression. The disclosed embodiments reduce sensitivity to the switches phase jitter to provide relaxed specifications for an internal main oscillator (IMO) clock and to exhibit no side effects in the attenuator operation. Other advantages will be apparent to those skilled in the art of sensing channel compensation hardware design and associated algorithms within a sensing device discussed hereinafter.

FIG. 1 is a schematic block diagram of a sensing device 100 such as a touch panel system that employs a low-noise, high-resolution baseliner according to various embodiments. The touch panel system can include circuitry and logic generally referred to as a touch controller that interfaces with a touch panel, touch screen, or button. As discussed, however, the sensing device 100 can be another touch or proximity sensor (water level sensors, capacitive position sensors, proximity sensors, fuel level meters, inductive sensors, and the like), and thus references to a touch panel are only exemplary. Systems disclosed herein can obtain not only capacitance measurements, but also inductance, impedance, resistance, and other electrical parameter measurements. These systems can further identify hover, proximity, and touch events based on such measurements, as can occur when a user or other substance hovers, gets near to, or touches the sensing device 100.

In these embodiments, the sensing device 100 includes components such as a set of sensing electrodes 102 coupled to one or more multiplexer 120 through which sensing circuitry can be selectively applied to one or more of the set of electrodes 102. The set of sensing electrodes 102 can include multiple transmit electrodes and multiple corresponding receive electrodes interposed between the multiple transmit electrodes. Due to the increasing size of touch panels and other sensing devices, these sensing electrodes can number in the dozens and the hundreds in some cases. The transmit electrodes can be driven to transmit a signal according to a scanning protocol or sequence and the receive electrodes adapted to receive the signal, thus obtaining sensed measurements of an electrical parameter (e.g., impedance or capacitance) between the transmit and receive electrodes.

The sensing device 100 can further include a transmit channel 110 (e.g., TX channel) that is configured to generate the signal provided to the set of sensing electrodes 102 that provides the signal used during a scanning sequence and forms the basis of subsequent measurements. Accordingly, the transmit channel 110 can include various components such as an amplifier and/or a buffer as well as a current source and/or a voltage source. For example, the transmit channel 110 can be coupled to a transmitter signal generator 112 and a charge pump 114. The transmitter signal generator 112 can be configured to generate a signal used to drive transmit electrodes of the set of sensing electrodes 102 during a scanning sequence and thus can configure the parameters of such a drive signal. The charge pump 114 can be configured to perform voltage regulation for the transmit channel 110, for example.

The sensing device 100 can further include one or more sensing channel 104 (e.g., RX channel), which is configured to receive the signal sensed by the set of electrodes 102, as can be generated by one or more receive electrodes. In various embodiments, the sensing channel 104 includes various components, such as an attenuator, integration capacitors, a current source, a current sink, a comparator, and the like as will be discussed in more detail. The sensing channel 104 can be coupled with the multiplexer 120, a common baseliner 105, and a processing unit 108. Moreover, the multiplexer 120 can be configured to selectively couple a sensing channel 104 and transmit channel 110 with particular sensing electrodes in accordance with the scanning sequence. Thus, the multiplexer 120 can include a transmit multiplexer for transmit electrodes and a sensing multiplexer for sensing, also referred to herein as receive, electrodes.

In various embodiments, the processing unit 108 is configured to include a controller (e.g., control logic and/or firmware) as well as one or more processors to perform sensing operations. The processing unit 108, for example, can be configured to identify and store measurement data in a memory device, as well as perform one or more computations to identify particular events, such as hover events, proximity events, or touch events.

In the disclosed embodiments, the common baseliner 105 includes clock sources, analog buffers, and a global baseliner circuit 125 that will be described in detail. Each of the sensing channels 104 can be adapted to include a channel baseliner circuit 130. Accordingly, a combination of the global baseliner circuit 125 and one of the channel baseliner circuits 130 can be understood to be a two-baseliner circuit as referred to herein. The global baseliner circuit 125 can be adapted to generate a gross compensation current to cancel out parasitic associated with the set of sensing electrodes 102 as a whole and can reduce power supply noise impact as well. Each channel baseliner circuit 130 can be adapted to generate a fine-tuned compensation current that is added to that of the global baseliner circuit 125 to further cancel parasitic associated with an individual sensing channel 104.

In some embodiments, the global baseliner circuit 125 includes a baseline signal generator 126 called SINEGEN. The baseliner signal generator 126 can receive a reference voltage ($V_{REF}$) generated by the transmitter signal generator 112 and thus know the phase of an excitation sinusoidal signal generated by the transmitter signal generator 112. The global baseliner circuit 125 and each channel baseliner circuit 130 can use this $V_{REF}$ to act as switching capacitor current source, so the generated compensation current does not depend on the $V_{REF}$ value itself, simplifying the compensation sources calibration. The compensation current eliminates parasitic capacitance (and/or other parasitic phenomena) generated by the set of sensing electrodes 102 in response to the excitation sinusoidal signal.

In some embodiments, the processing unit 108 is configured to perform a phase calibration (FIG. 15) between a phase of the excitation sinusoidal signal generated by the transmitter signal generator 112 and the sensing channels 104, e.g., a phase that results in peak currents in the sensing channels 104. Further, the processing unit 108 can perform calibration (FIG. 16) of the global baseliner circuit 125, e.g., to determine a global baseliner amplitude value (ΔV) with which to program the global baseliner circuit 125. Additionally, the processing unit 108 can perform a calibration (FIG. 17) of the channel baseliner circuit 130, e.g., to determine a channel baseliner amplitude value with which to program the channel baseliner circuit 130.

Figure 2A:
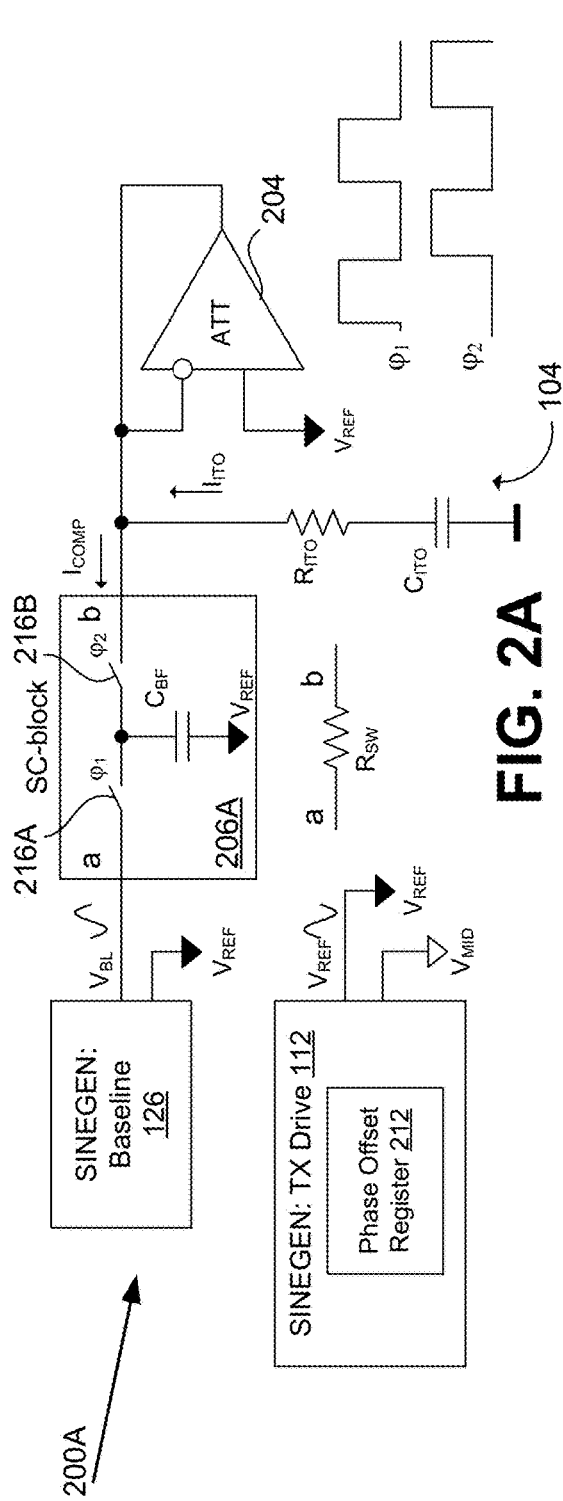
FIG. 2A is a schematic block diagram of a basic switched capacitor baseliner circuit according to an embodiment.

FIG. 2A is a schematic block diagram of a basic switched capacitor baseliner circuit 200A according to an embodiment. As discussed with reference to FIG. 1, the baseliner circuit 200A can include two sinusoidal signal generation sources, the transmitter signal generator 112 to generate the excitation sinusoidal signal (which can be provided to the baseliner circuit 200A as $V_{REF}$) and the baseline signal generator 126, $V_{BL}$, to provide a compensation current into the sensing channels 104. As can be seen, the baseline voltage ($V_{BL}$) output from the baseliner signal generator 126 is generally in phase shifted of the excitation voltage, $V_{REF}$, as the sensing panel $R_{ITO}C_{ITO}$ acts as a differentiating network and the voltage difference between $V_{BL}$ and $V_{REF}$ can be used to ultimately generate the compensation current. Thus, the baseliner circuit 200 can form the compensation current to be in-phase with the sensing current, but having an opposite sign. The compensation current, $I_{COMP}$, can be determined by the voltage differences between $V_{REF}$ and $V_{BL}$, as the switching capacitor $C_{BF}$ acts as equivalent resistor. The baseline signal generator 126 can, however, be employed so that the sense current waveform is phase-different compared to the excitation sinusoidal waveform due to the phase shift in the sensing panel, e.g., which has distributed trace resistance ($R_{ITO}$) and capacitance ($C_{ITO}$). Further, the transmitter signal generator 112 can include a phase offset register 212 to which the processing unit 108 can program a phase offset value as will be discussed with reference to FIG. 15.

In some embodiments, the baseliner circuit 200A includes a switched capacitor 206A, including a capacitor $C_{BF}$, coupled with a sensing channel 104 and a first input to an attenuator 204, where a second input to the attenuator 204 is the reference voltage ($V_{REF}$) generated by the transmitter signal generator 112. The attenuator 204 has a programmable gain, can be calibrated as will be discussed, and outputs an attenuated current. In some embodiments, the attenuator keeps the panel input terminal voltage level at the same as the reference voltage level $V_{REF}$. The switched capacitor 206A includes a pair of switches, e.g., a first switch 216A and a second switch 216B, that operate at two non-overlapping phases ($\varphi_1$ and $\varphi_2$), respectively. The capacitor $C_{BF}$ can be connected to the reference voltage ($V_{REF}$) by its bottom terminal. In one embodiment, the switched capacitor 206A represents an equivalent resistor ($R_{SW}$) connected between terminals a and b.

Figure 2B:
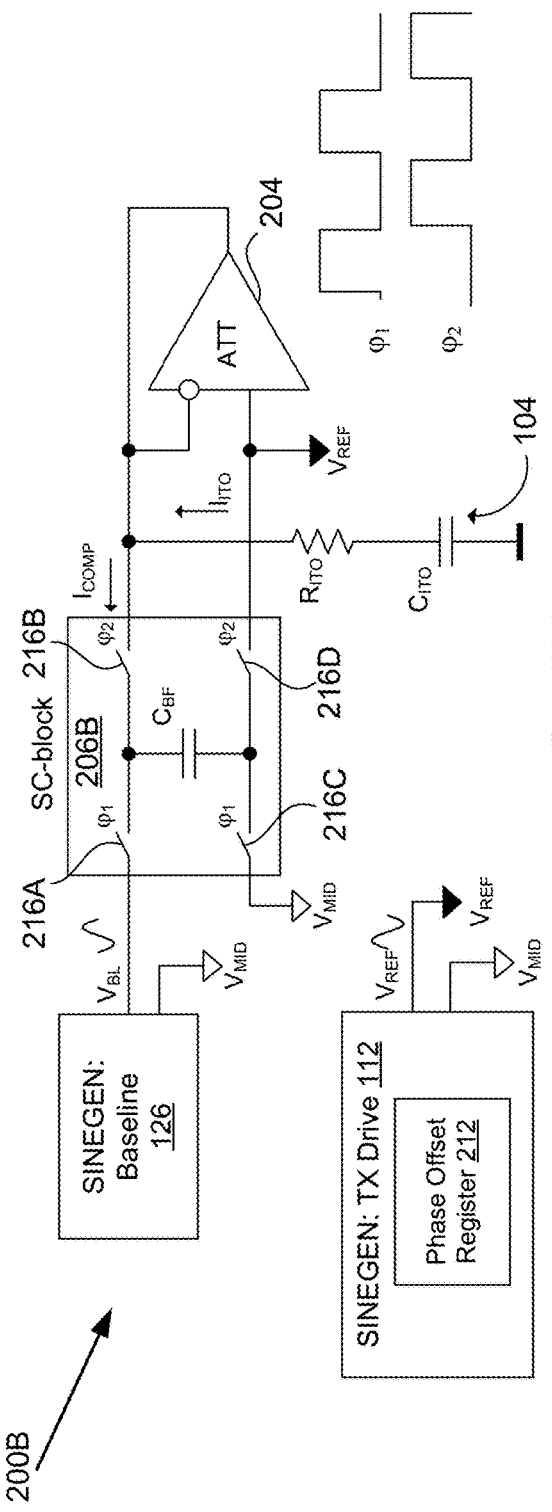
FIG. 2B is a schematic block diagram of a floating switched capacitor baseliner circuit according to an embodiment.

FIG. 2B is a schematic block diagram of a floating switched capacitor baseliner circuit 200B according to an embodiment. A switched capacitor 206B of the baseliner circuit 200B is floating in the sense of having a capacitor $C_{BF}$ with an opposite end thereof coupled, using a second pair of switches, between a baseliner output voltage ($V_{BL}$) from the baseliner signal generator 126 and the $V_{REF}$ at the second input of the attenuator 204. In this way, the reference source for the capacitor $C_{BF}$ is not $V_{REF}$ per se and can vary between $V_{BL}$ and $V_{REF}$. Therefore, the floating switching capacitor samples the baseliner output voltage $V_{BL}$ at the phase $\varphi_1$ and discharges to the sensing channel and panel at the phase $\varphi_2$, as the attenuator 204 keeps the levels on the both input terminals same to the $V_{REF}$. The second pair of switches can include a third switch 216C and a fourth switch 216D, which also operate at the two non-overlapping phases ($\varphi_1$ and $\varphi_2$). $V_{MID}$ can be an intermediate DC level, e.g., half of the TX power supply in some embodiments.

Figure 3:
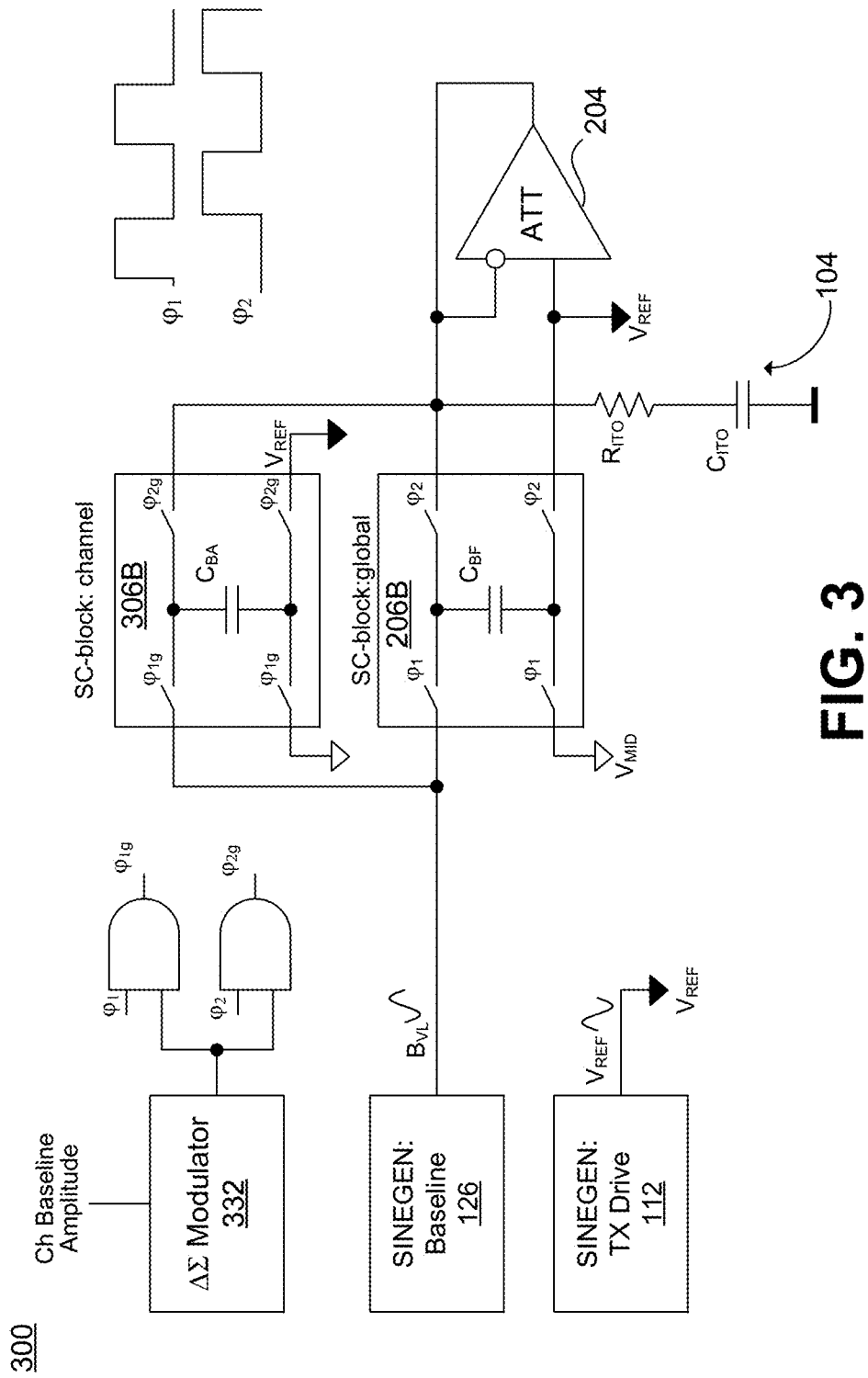
FIG. 3 is a schematic block diagram of a two-baseliner circuit that employs a sigma-delta modulator for a channel baseliner circuit according to an embodiment.

FIG. 3 is a schematic block diagram of a two-baseliner circuit 300 that employs a sigma-delta modulator 332 for a channel baseliner circuit adjustment, such as the channel baseliner circuit 130 of FIG. 1 according to an embodiment. In this two-baseliner circuit 300, the global baseliner circuit 125 can include the baseline signal generator 126, and the channel baseliner circuit 130 can further include a first switched capacitor, e.g., the switched capacitor 206B of FIG. 2B, and a second switched capacitor 306B with capacitor $C_{BA}$, e.g., another of the switched capacitor 206B of FIG. 2B coupled in parallel to the first switched capacitor 206B, so the switched capacitor 206B is replicated twice.

In various embodiments, the sigma-delta modulator 332 generates, from a fixed or variable input code (depending on the specific embodiment), a density-modulated bit stream that is fed into a pair of AND gates. One each of a pair of clock signals of non-overlapping phases ($\varphi_1$ and $\varphi_2$) can also be fed as inputs to each AND gate, respectively, generating a first density-modulated clock signal ($\varphi_{1g}$) and a second density-modulated clock signal ($\varphi_{2g}$) as outputs. These first and second density-modulated clock signals can then be used to drive the input switches and the output switches, respectively, of the second switched capacitor 306B.

As the threshold range of each sigma-delta modulator 332 (for each of the channel baseliner circuits 130) can be driven separately, the two-baseliner circuit 300 enables sinusoidal compensation waveform generation and high-resolution compensation charge adjustment at the sensing channel level by the clocked gating of the second switched capacitor 306B. Thus, the sigma-delta modulator 332 enables fine adjustment of the channel baseline current compensation, as the sensing channel 104 accumulates quantization error over multiple TX periods. In this way, the sigma-delta modulator 332 enables the spreading of compensation charge across multiple transmit periods without fine adjustment resolution loss. Further, each of these switched capacitors 206B and 306B can operate at a fixed, high frequency (e.g., 24 MHz or higher) to generate sufficient compensation charge for a low transmission frequency, e.g., in the order of 100 kHz, enabling to keep the baseliner capacitors $C_{BA}$ and $C_{BF}$ small.

In some embodiments, the sigma-delta modulator 332 operates as code to a density converter. Depending on the embodiment, input for the sigma-delta modulator 332 can be either a sinusoidal data stream or some constant value (optionally dithered). In most embodiments, the sigma-delta modulator generates the envelope of the sinusoidal compensation current, reflecting the rectified sinusoid. However, the sign of the compensation current is determined separately. Thus, using the combination of the rectified sinusoid and separate sign signal, a bipolar sinusoidal compensation current is formed. In the most embodiments the channel baseliner sigma-delta modulator is fed by some constant or constant plus dithering code.

Figure 4:
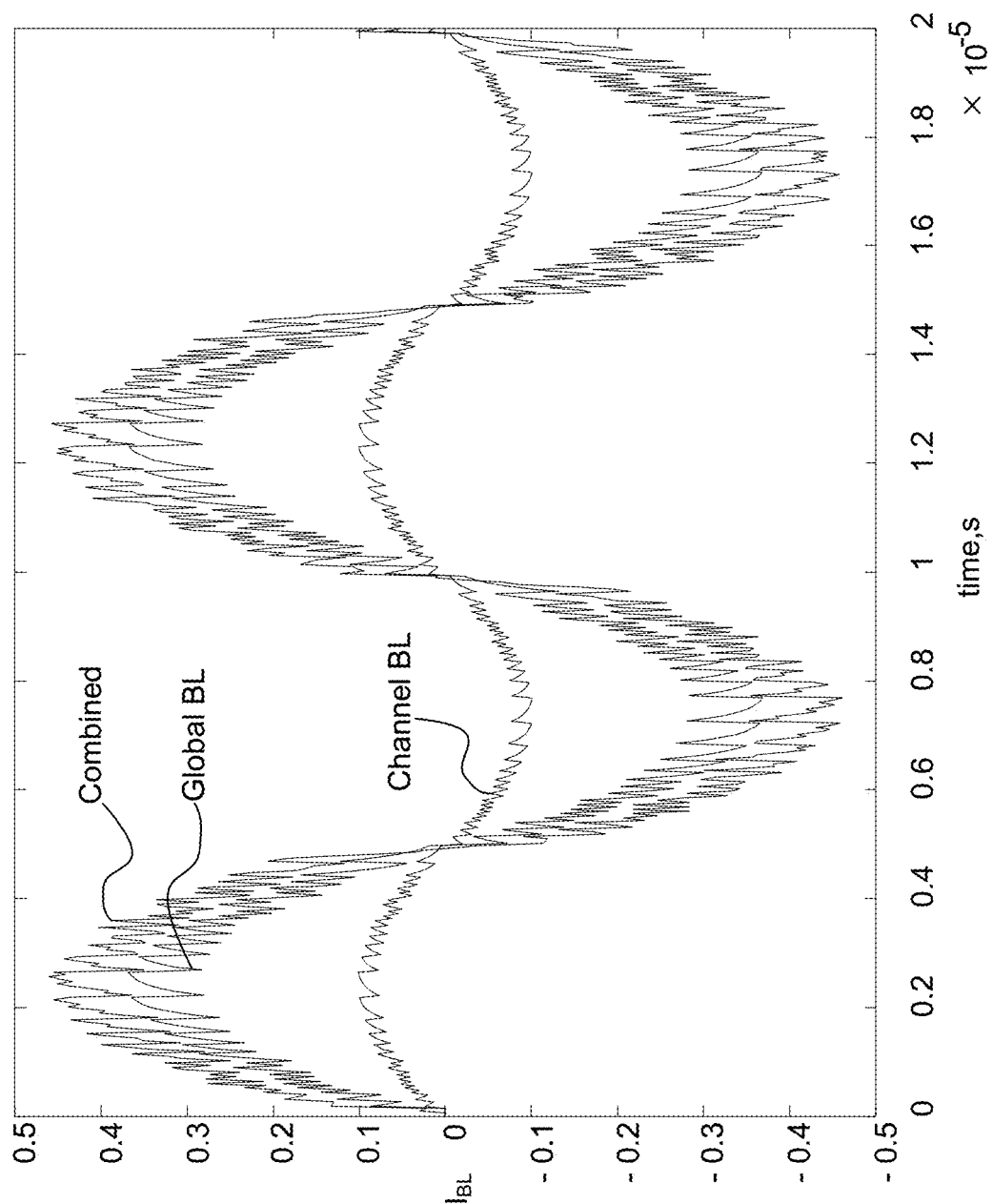
FIG. 4 is a graph illustrating a compensation current generated by the switched capacitors of the two-baseliner circuit of FIG. 3 according to an embodiment.

FIG. 4 is a graph illustrating a compensation current generated by the switched capacitors of the two-baseliner circuit of FIG. 3 according to an embodiment. The baseliner circuit 300 can operate as a series of short current pulses, injected in the $\varphi_2$ phase, where FIG. 4 shows the filtered current waveforms of the global baseliner circuit, the channel baseliner circuit, and the two combined.

Figure 5A:
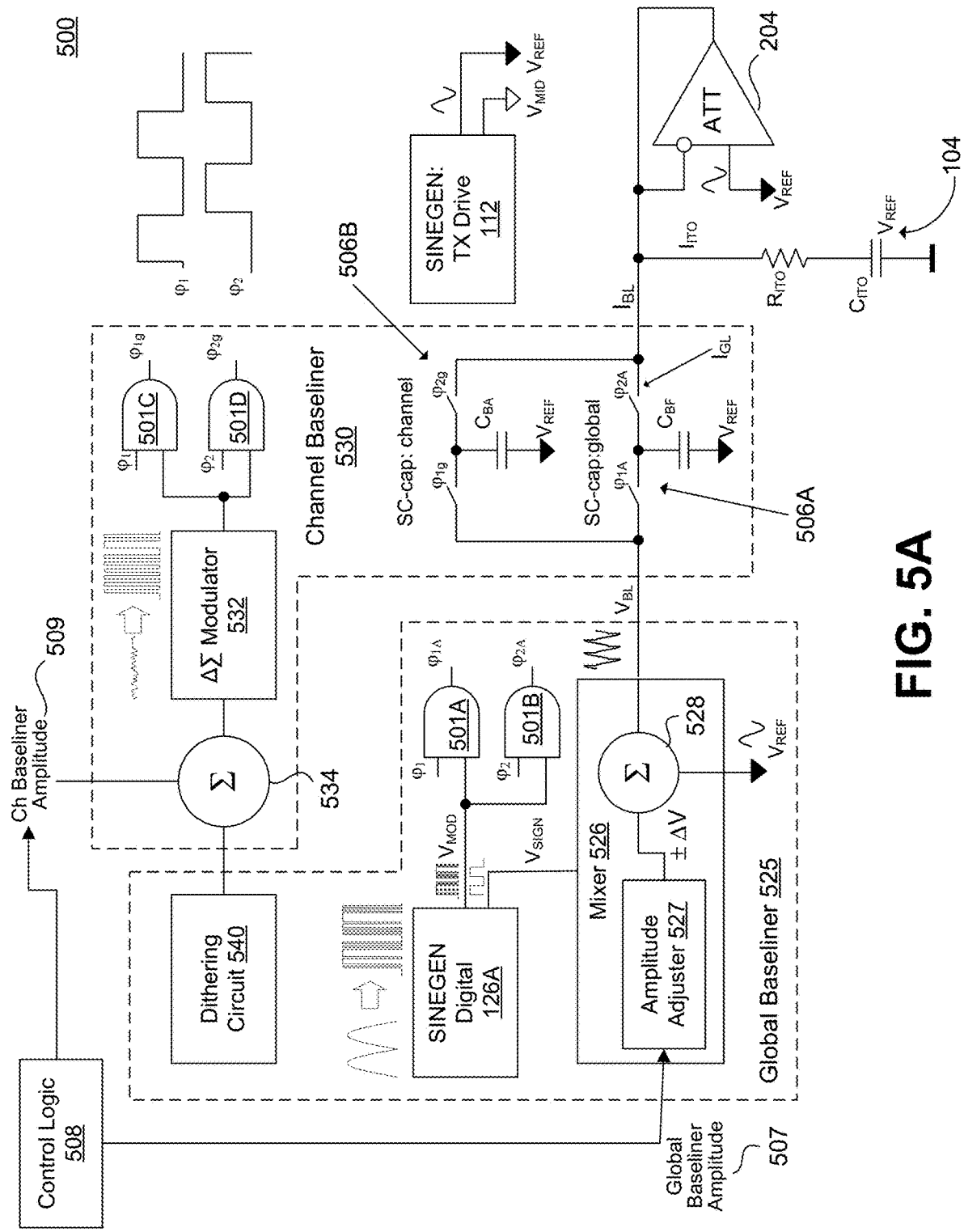
FIG. 5A is a schematic block diagram of a two-baseliner circuit that employs a sigma-delta modulator for each of a global baseliner circuit and a channel baseliner circuit according to an embodiment.

FIG. 5A is a schematic block diagram of a two-baseliner circuit 500 that employs a sigma-delta modulator for each of a global baseliner circuit and a channel baseliner circuit according to an embodiment. In various embodiments, the two-baseliner circuit 500 includes a global baseliner 525 and a channel baseliner 530 operatively coupled with the global baseliner circuit 525, with at least one sensing electrode of a sensing channel 104, and with a first input of the attenuator 204. As before the reference voltage ($V_{REF}$) is input into the second (high-impedance) input of the attenuator 204. The two-baseliner circuit 500 further includes control logic 508 (e.g., all or a portion of the processing unit 108 of FIG. 1), which can be used to generate a global baseliner amplitude value 507 and a channel baseliner amplitude value 509 used to provide variable adjustment to the compensation current to be provided to the sensing channel 104, as will be discussed in detail.

In various embodiments, the global baseliner circuit 525 includes a signal generator 126A, a mixer 526 having an amplitude adjuster 527 and a summer 528, a pair of AND gates coupled with the signal generator 126A, and a dithering circuit 540 having a pseudo-random source. In some embodiments, the channel baseliner circuit 530 includes a first switched capacitor 506A (also referred to as a global baseliner switched capacitor), a second switched capacitor 506B (also referred to as a channel baseliner switched capacitor), a delta-sigma modulator 532, a pair of AND gates coupled with the delta-sigma modulator 532, and a summer 534 coupled between the dithering circuit 540 and the delta-sigma modulator 532.

In disclosed embodiments, the signal generator 126A generates a first density-modulated bit stream ($V_{MOD}$) and a square wave ($V_{SIGN}$) having a frequency matching that of the excitation sinusoidal signal ($V_{REF}$), e.g. 100 kHz in some embodiments. The signal generator 126A can be a digital portion of the baseliner signal generator 126, which includes a delta-sigma modulator, and which will be discussed in operational detail with reference to FIG. 9. The signal generator 126A can thus provide a bit-stream for global baseliner switched capacitors. That stream reflects the magnitude of a sinusoidal signal and separates the sign bit of the sinusoidal signal to adjust the compensation current polarity to be opposite to the expected input current polarity of the sensing channel 104. The signal generator 126A can also generate a square wave output with the same frequency as the excitation sinusoidal signal.

Figure 5B:
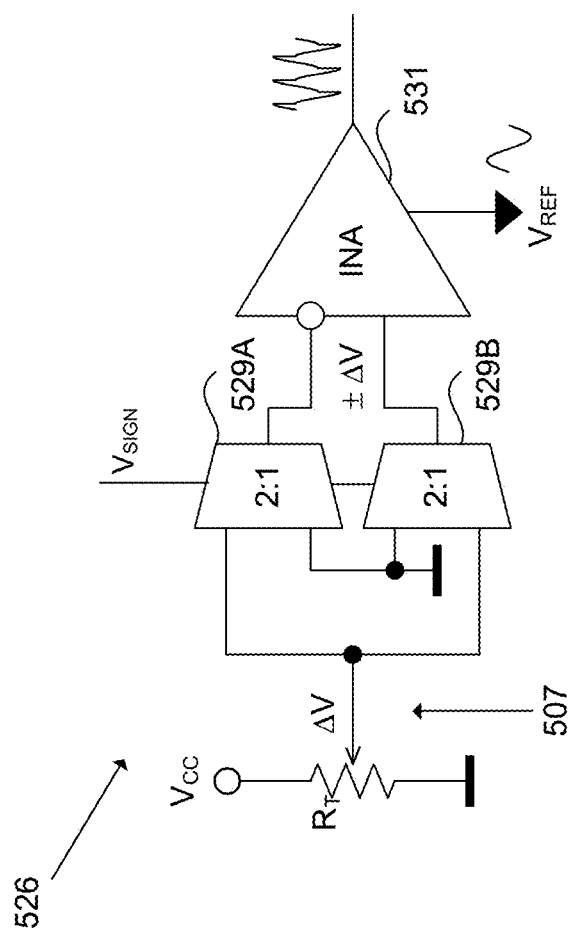
FIG. 5B is a schematic block diagram of an exemplary implementation of the mixer of the global baseliner circuit of FIG. 5A according to an embodiment.

In one embodiment, the global baseliner circuit 525 can use the square wave to modulate the baseliner compensation signal polarity provided at an output of the global baseliner circuit. More specifically, the amplitude adjuster 527 can generate an amplitude-adjusted rectangular signal via use of the square wave to alter (e.g., invert) a sign of the global baseliner amplitude value 507, which is variably-adjustable by the control logic during calibration. The summer 528 can then combine the excitation sinusoidal signal ($V_{REF}$) with the amplitude-adjusted rectangular signal (±ΔV) to provide a coarse adjustment to a modulated excitation sinusoidal signal to be fed into the switched capacitors 506A and 506B. There are various ways to implement the mixer 526, one of which is illustrated in FIG. 5B. In other words, the $V_{BL}$ is the sum of the excitation sinusoidal signal and the rectangular signal that is used for the switching capacitor baseliner circuit. As the bottom terminals of the capacitors $C_{BA}$ and $C_{BF}$ are connected to the sinusoidal reference source $V_{REF}$, the compensation current can be determined by the combination of the amplitude adjusted output ΔV and the density of the delta-sigma modulator output, e.g., and not depend on the reference voltage $V_{REF}$ itself.

FIG. 5B is a schematic block diagram of an exemplary implementation of the mixer 526 of the global baseliner circuit 525 of FIG. 5A according to an embodiment. The mixer 526 can include a variable resistor ($R_T$) coupled between a supply voltage and ground. A tap point of the variable resistor is adjustable using the global baseliner amplitude value 507 (e.g., ΔV) determined during calibration of the global baseliner circuit, as per FIG. 16, for example. The mixer 526 can further include a pair of 2:1 multiplexers 529A and 529B selectively controlled by the square wave ($V_{SIGN}$) to set a sign of a voltage from the variable resistor as inverse to that of the square wave and output the amplitude-adjusted rectangular signal (±ΔV). The mixer 526 can further include an instrumentation amplifier 531 to sum the excitation sinusoidal signal with the amplitude-adjusted rectangular signal, thus generating the modulated excitation sinusoidal signal.

In other words, the mixer 526 can be understood to perform three functions. First, the mixer 526 enables coarse adjustment of compensation signal magnitude ΔV using programmable potentiometer RT. The mixer 526 alternates polarity of the compensation signal using the sign output of the SINEGEN source, e.g., the SINEGEN magnitude output can be used to determine the density of the switching capacitor circuit clock signals and form the sinusoidal compensation signal. Further, the mixer 526 adds the ±ΔV reference voltage $V_{REF}$ (see Equation (1) to make the compensation current independent from $V_{REF}$ without using the floating switching capacitor circuits (where the floating capacitors can have some side complications).

Figure 13:
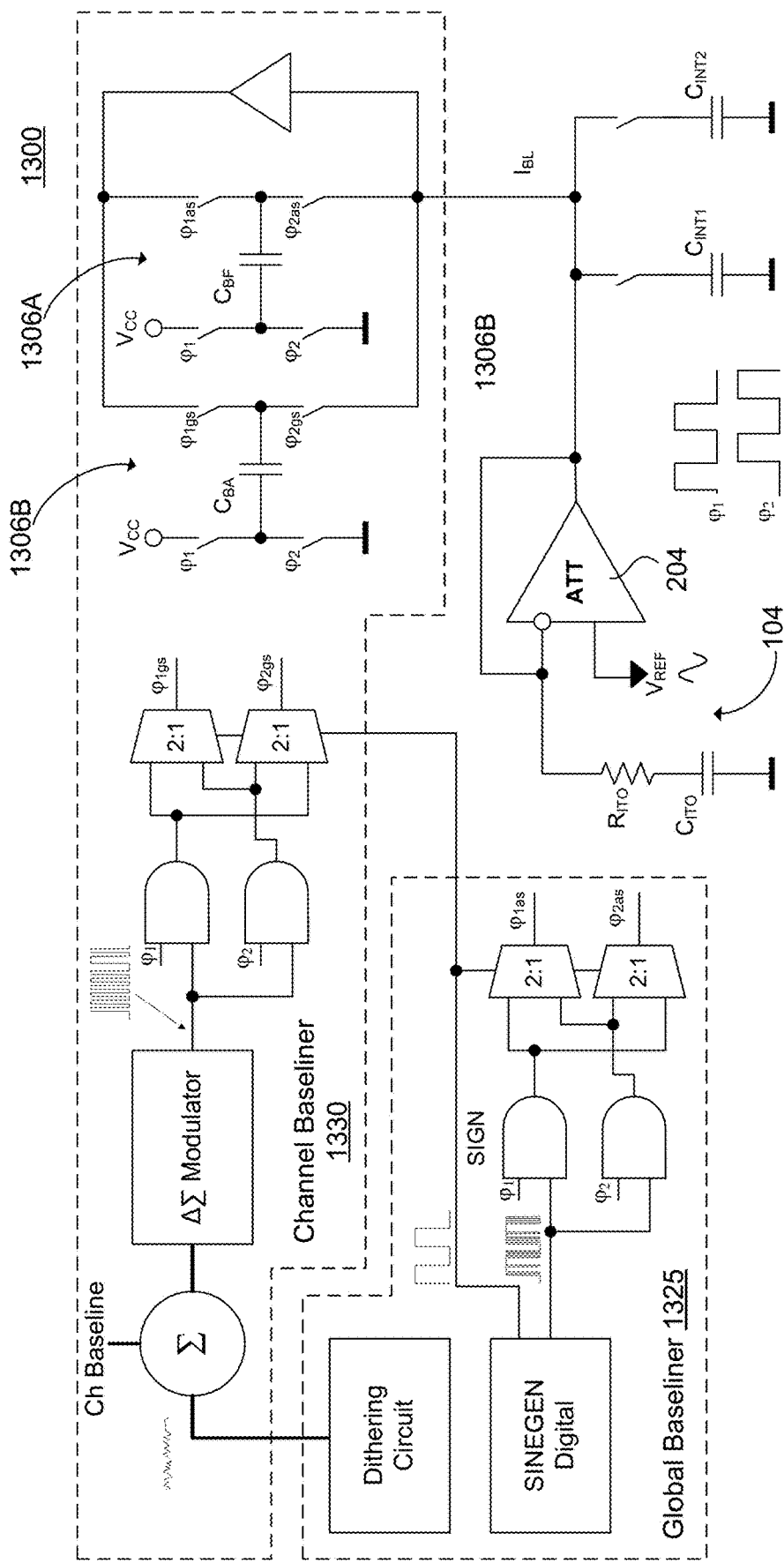
FIG. 13 is a schematic block diagram of an alternative two-baseliner circuit adapted to inject compensation current directly into integration capacitors of the sensing channel according to an embodiment.

With additional reference to FIG. 5A, in some embodiments, the first and second switched capacitors 506A and 506B are similar to the switched capacitor 206A of FIG. 2A, but in other embodiments, can be similar to the switched capacitor 206B of FIG. 2B (see FIG. 13). In these embodiments, the first switched capacitor 506A is coupled between the output of the global baseliner circuit 525 and the first input of the attenuator 204. The first switched capacitor 506A includes a first pair of switches controlled by a first pair of gated clock signals ($\varphi_{1A}$ and $\varphi_{2A}$) generated by the first density-modulated bit stream. The second switched capacitor 506B is coupled in parallel with the first switched capacitor 506A and includes a second pair of switches controlled by a second pair of gated clock signals ($\varphi_{1g}$ and $\varphi_{2g}$) generated by a second density-modulated bit stream, generated by the delta-sigma modulator 532.

In various embodiments, the pair of AND gates coupled with the signal generator 126A includes a first AND gate 501A to receive inputs including a first clock signal ($\varphi_1$) and the first density-modulated bit stream ($V_{MOD}$ from the signal generator 126A) and to output a first density-modulated clock signal ($\varphi_A$) to a first switch of a first pair of switches of the first switched capacitor 506A. The pair of AND gates can further include a second AND gate 501B to receive inputs including a second clock signal ($\varphi_2$) and the first density-modulated bit stream and to output a second density-modulated clock signal ($\varphi_{2A}$) to a second switch of the first pair of switches of the first switched capacitor 506A. As before, phases of the first clock signal and the second clock signal are non-overlapping. In some embodiments, the AND gates thus perform gating the switching capacitor clock signals according to the sigma-delta modulator output envelope and actually form the compensation current waveform.

With additional reference to the channel baseliner circuit 530, in various embodiments, the delta-sigma modulator generates the second density-modulated bit stream based on a variable DC input, e.g., the channel baseliner amplitude value 509 provided by the control logic 508. In some embodiments, the dithering circuit 540 provides a pseudo-random signal that the summer 534 can combine with the channel baseliner amplitude value 509 before being input into the sigma-delta modulator 532. A "dither" is an intentionally applied form of noise used to randomize quantization error which, in this case, works to break periodic modes in the sigma-delta modulator 532 and reduces potential emission via a sensing panel or other sensor having sensing electrodes. Providing the dithering circuit 540 within the global baseliner circuit 525 enables sharing this additional component resource across the sensing channels 104. The dithering circuit 540 is reset for each scanning burst, so no dithering does not add any noise in the CDC readings, as dithering impact is same across multiple TX scanning bursts.

In some embodiments, the pair of AND gates in the channel baseliner circuit 530 includes a third AND gate 501C to receive inputs including a first clock signal ($\varphi_1$) and the second density-modulated bit stream and to output a third density-modulated clock signal ($\varphi_{1g}$) to a first switch of the second pair of switches. The channel baseliner circuit 530 can further include a second AND gate 501D to receive inputs including a second clock signal ($\varphi_2$) and the second density-modulated bit stream and to output a second density-modulated clock signal ($\varphi_{2g}$) to a second switch of the second pair of switches.

The two-baseliner circuit 500 can be understood to operate by the mixer 526 summing the sinusoidal reference signal ($V_{REF}$) and the amplitude-adjusted rectangular signal that reflects the output of the baseliner sign signal, namely:

$$V_{BL} = V_{REF} \pm \Delta V. \quad (1)$$

The switched capacitors 506A and 506B are charged to the $\Delta V$ voltage in phases $\varphi_1$ and $\varphi_{1g}$. The average compensation current of the two-baseliner circuit 500 can be expressed by Equation (2):

$$I_{BL} = \Delta V \cdot f_{SW}(c_{BA}d_c + C_{BF}d_g) \quad (2)$$

where $\Delta V$ is the adjustable voltage for the baseliner compensation, $C_{BA}$, $C_{BF}$ are switching capacitors values, and $d_g$, $d_c$ are bit stream density values output by the global and channel sigma-delta modulators, respectively.

Figure 6:
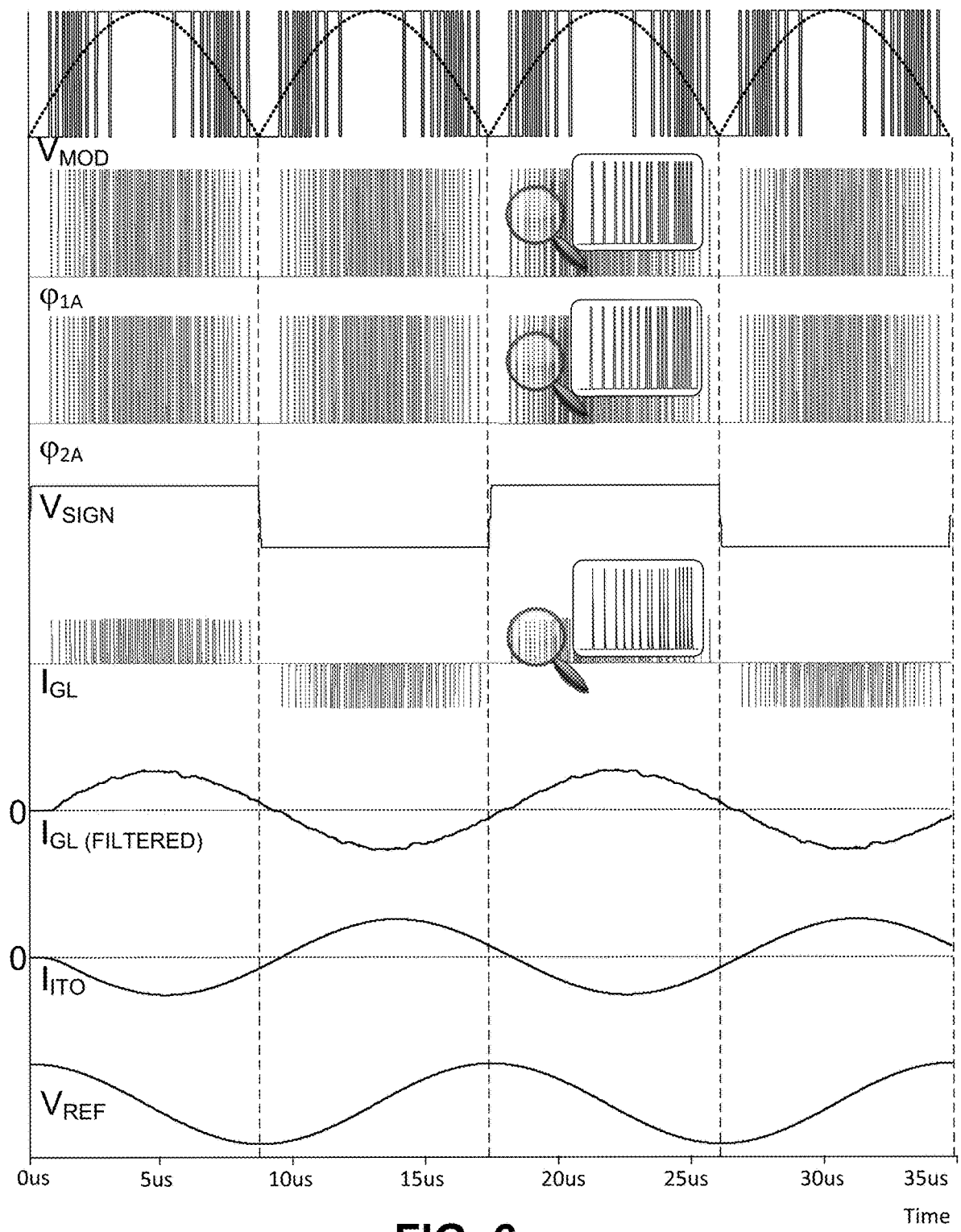
FIG. 6 is a graph illustrating numerous operational waveforms generated at different points of the two-baseliner circuit of FIG. 5A according to an embodiment.

FIG. 6 is a graph illustrating numerous operational waveforms generated at different points of the two-baseliner circuit of FIG. 5A according to an embodiment. The waveforms illustrated in FIG. 6 are as follows. The modulated voltage ($V_{MOD}$) is the global baseliner single-bit $\Delta\Sigma$-modulator output (represents the rectified baseline compensation sinusoidal waveform magnitude) from the signal generator 126A. Waveforms $\varphi_{1A}$, $\varphi_{2A}$ are gated global baseliner clocks. Waveform $V_{SIGN}$ is the output from the global baseliner $\Delta\Sigma$-modulator, which represents the sign of the baseline sinusoidal signal. Waveform $I_{GL}$ is the output current of the first switched capacitor 506A, e.g., the global baseliner switched capacitor and thus the compensation input into the sensing channel 104. Waveform $I_{GL\,(FILTERED)}$ is filtered (by a low-pass filter) based on the global baseliner circuit 525 output current. The filter is not part of the two-baseliner circuit, but the filtered waveforms are shown for the density change over TX half-period visualization simplification. Waveform $I_{ITO}$ is the panel electrode input current. Waveform $V_{REF}$ is the attenuator reference voltage, which represents the sinusoidal excitation signal for the SE-SC-SINE sensing mode.

As observed, the sensing panel electrode current $I_{ITO}$ is phase leading the sense voltage $V_{REF}$, as panel electrodes act as differentiating RC network. The two-baseliner circuit 500 generates the compensation current that is phase aligned to the sense current (achieved by the phase alignment procedure of FIG. 15) but has the opposite sign compared to electrode current to provide current compensation. The switched capacitor circuits provide the series of the short current pulses with variable density, where density change over half-period represents sinusoidal. The sensing waveforms collected for the SE-SC-SINE sensing mode are via sinusoidal excitation (driven by $V_{REF}$ change). However, the two-baseliner circuit 500 can operate with no changes in the mutual capacitance sensing mode (MC-SINE mode) where $V_{REF}$ is kept constant. Supporting the MC-SINE mode facilitates the multi-phase excitation sequences with larger elements summed together in providing enhanced noise suppression.

Figure 7:
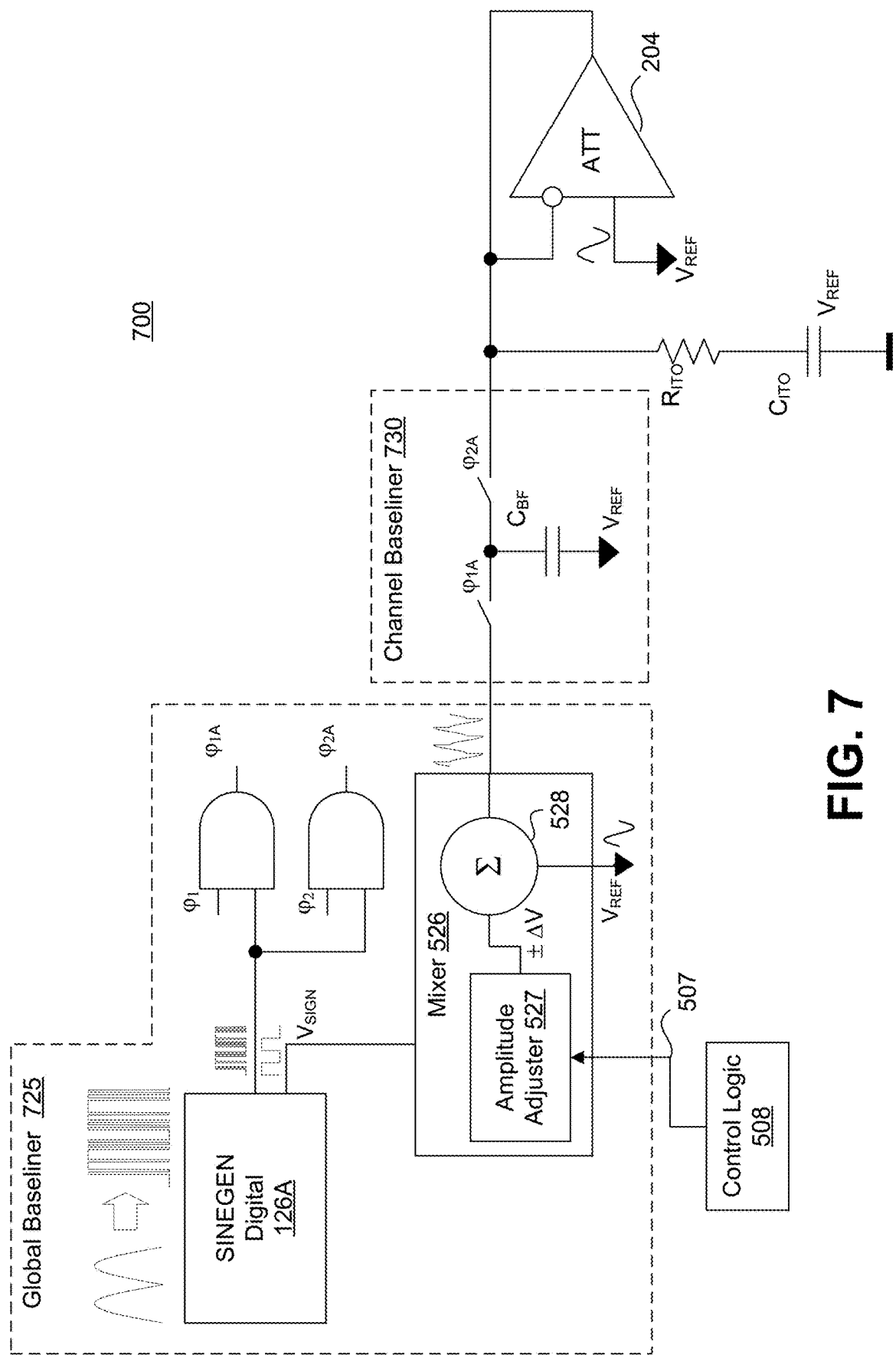
FIG. 7 is a schematic block diagram of a two-baseliner circuit that is a modified version of the two-baseliner circuit of FIG. 5A according to an embodiment.

FIG. 7 is a schematic block diagram of a two-baseliner circuit 700 that is a modified version of the two-baseliner circuit 500 of FIG. 5A according to an embodiment. The two-baseliner circuit 700 includes a global baseliner circuit 725 and a single switching capacitor channel baseliner circuit 730. The global baseliner circuit 725 does not include the dithering circuit 540 and the mixer 526 can also be instantiated as the mixer 526 of FIG. 5B. In some embodiments, the channel baseliner circuit 730 is simplified to include just the first switched capacitor 506A. While this embodiment eliminates the features of channel-to-channel compensation current adjustment, the two-baseliner circuit 700 can perform adequately in sensing devices with low electrode-to-electrode capacitance (or other electrical parameters) mismatch. The common compensation current amplitude adjustment can be accomplished in combination with the $\Delta V$ adjustments for the coarse tuning and modulator dynamic range adjustment for the fine tuning.

Figure 8:
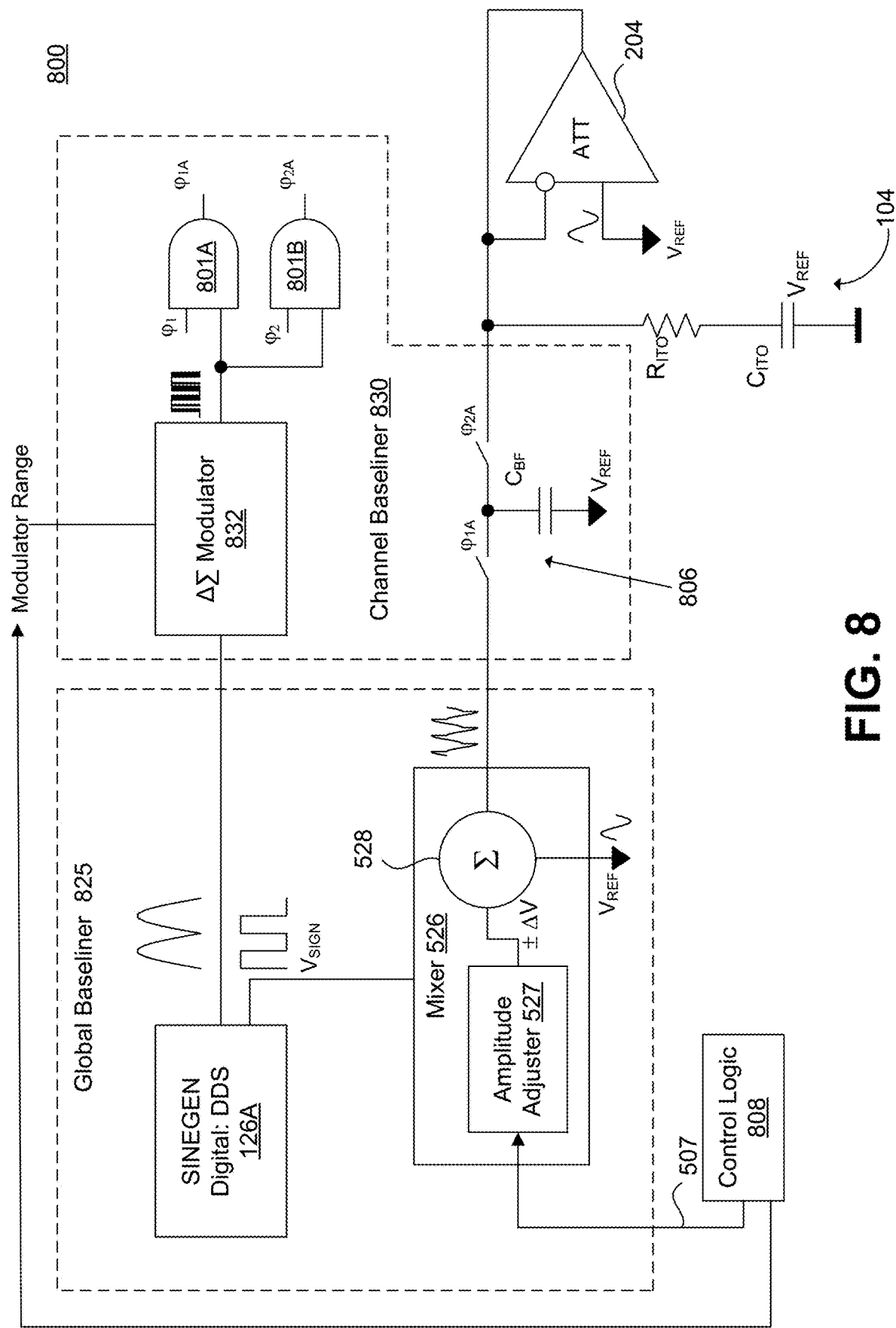
FIG. 8 is a schematic block diagram of a two-baseliner circuit that is another modified version of the two-baseliner circuit of FIG. 5A according to an embodiment.

FIG. 8 is a schematic block diagram of a two-baseliner circuit 800 that is another modified version of the two-baseliner circuit of FIG. 5A according to an embodiment. The two-baseliner circuit 800 includes a global baseliner circuit 825 similar to the global baseliner circuit 525, except the removal of the dithering circuit 540 and the first pair of AND gates 501A and 501B, thus being simplified. The two-baseliner circuit 800 further includes a channel baseliner circuit 830 that has also been simplified with the removal of the summer 534 and the first switched capacitor 506A, e.g., the global baseliner switched capacitor. Thus, the compensation source of the signal generator 126A is retained, while compensation adjustment via a sigma-delta modulator 832 can be provided in each channel baseliner circuit 830, e.g., to provide density-modulated clock signals to a switched capacitor 806 associated with each respective sensing channel 104. The two-baseliner circuit 800 may have reduced resolution for the compensation current adjustments, but can still be sufficient for many practical applications.

In similar embodiments to the global baseliner 525, the mixer 526 can generate an amplitude-adjusted rectangular signal via the use of the square wave to alter a sign of a global baseliner amplitude value, and combine the excitation sinusoidal signal with the amplitude-adjusted rectangular signal to provide a coarse adjustment to a modulated excitation sinusoidal signal. The mixer 526 can also be implemented as illustrated in FIG. 5B in one embodiment, although others are envisioned.

In some embodiments, the global baseliner circuit 825 is coupled with multiple sensing channels 104 of a sensing device, such as the sensing device 100. In these embodiments, the global baseliner circuit 825 includes the signal generator 126A to generate a rectified sinusoidal signal and a square wave having a frequency matching that of an excitation sinusoidal signal used to excite sensing electrodes of the sensing device. In one embodiment, the signal generator 126A is adapted with direct digital synthesis to generate these waveforms. The global baseliner circuit 825 can use the square wave to modulate the excitation sinusoidal signal ($V_{REF}$) provided at an output of the global baseliner circuit. The two-baseliner circuit 800 can further include control logic 808 to variably adjust a threshold (or a full-scale range) of the sigma-delta modulator, based on the calibration of the channel baseliner circuit 830, to fine-tune values of the density-modulated bit stream, which is proportional to the modulator threshold and inversely proportional to the sigma-delta modulator dynamic range.

Further, according to some embodiments, the channel baseliner circuit 830 is coupled between the global baseliner circuit 825 and a sensing channel 104 of the multiple sensing channels. The channel baseliner circuit 830 can include a switched capacitor 806 coupled between the output of the global baseliner circuit 825 and the sensing channel 104. The sigma-delta modulator 832 can be coupled with the signal generator 126A and generate, from the rectified sinusoidal signal, a density-modulated bit stream. The channel baseliner circuit 830 can further include a pair of gates to use the density-modulated bit stream and non-overlapping-phase clock signals to generate outputs including density-modulated clock signals sent to switches of the switched capacitor.

More specifically, the pair of gates can include a first AND gate 801A to receive inputs including a first clock signal, of the non-overlapping-phase clock signals, and the density-modulated bit stream and to output a first density-modulated clock signal to a first switch of the switched capacitor 806. A second AND gate 801B can receive inputs including a second clock signal, of the non-overlapping-phase clock signals, and the density-modulated bit stream and to output a second density-modulated clock signal to a second switch of the switched capacitor 806.

Figure 9:
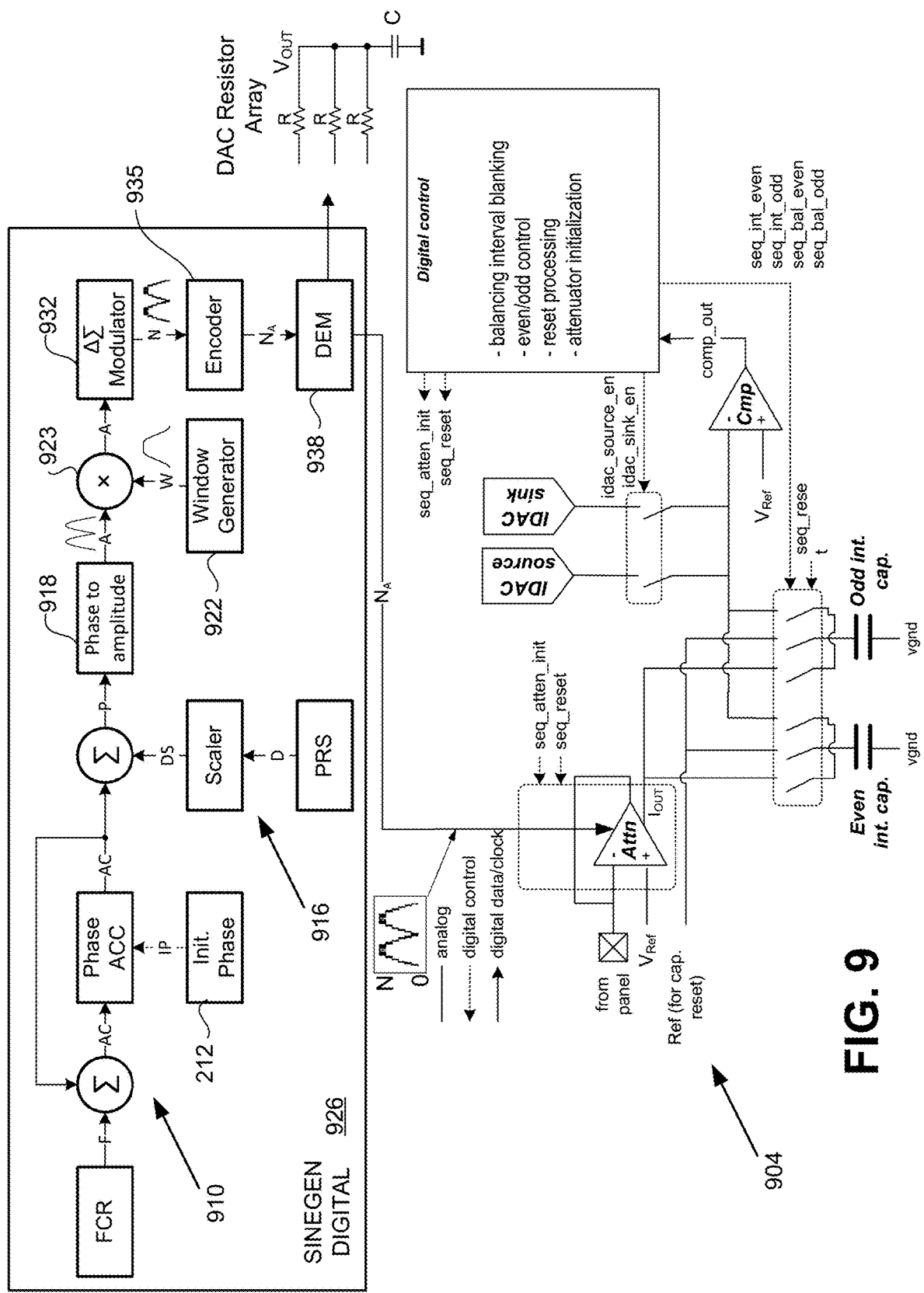
FIG. 9 is a schematic block diagram of a modified sensing channel that employs sinusoidal demodulation according to an embodiment.

FIG. 9 is a schematic block diagram of a modified sensing channel 904 that employs sinusoidal demodulation according to an embodiment. The sinusoidal demodulation can be performed by a digital signal generator 926, which can be understood to also represent the digital portion (e.g., using direct digital synthesis) of any of the signal generators discussed herein. The demodulated sinusoidal signal (NA) can be provided directly to the control input of an attenuator of the sensing channel, as illustrated, in one embodiment. Therefore, the run-time variable gain attenuator acts as discrete time mixer and performs the sinusoidal demodulation function. In the simplest implementation, the variable gain attenuator might be coupled with binary gain switching mechanism to implement the attenuator on/off output current feature, implementing the simplest, discrete time binary mixer. The frequency transfer function of the channel with this kind of mixer is very similar to convenient sensing channel that has analog mixer, however, needs the anti-aliasing low-pass filter as mixer operates in the discrete time.

In various embodiments, the digital signal generator 926 provides a low-distortion sinusoidal signal without using high-precision, expensive analog components employed in some signal generators. Further, the digital signal generator 926 can serve as a digital stream generator that represents the sinusoidal signal. In these various embodiments, there are several use cases for the digital signal generator 926, including low-distortion sinusoidal signal generation for the panel excitation (referred to herein as the excitation sinusoidal signal, $V_{REF}$), demodulation signal generation for the sensing channel 904 with sinusoidal demodulation, and generation of the sinusoidal signal (either in the analog form or digital) for the baseliner operation. In some embodiments, a signal generator that includes the digital signal generator 926 can also include analog sign generation circuitry in order to provide an analog output signal, if required for the baseliner circuit operation. In this way, the signal generator described herein can enable hardware resources to re-use in being able to generate multiple waveforms and bit streams at the same time using either one instance of the SINGEN block for the several different purposes or multiple instances of same block type, reducing the design and verification efforts.

In various embodiments, the digital signal generator 926 includes a phase accumulator circuit 910, a dithering circuit 916, a phase-to-amplitude circuit 918, a window generator 922, a multi-level sigma-delta modulator 932, an encoder 935, and a dynamic element match (DEM) circuit 938. These components are generally interconnected in order, as in a pipeline, to generate an outgoing wave.

In some embodiments, the phase accumulator circuit 910 adds (using a summer), each cycle, a value stored in a Frequency Control Register (FCR) to an accumulator ("phase ACC"), which begins with an initial phase ("Init. Phase"). The phase accumulator circuit 910 determines the output frequency based on the FCR register value. After the system reset, the phase accumulator circuit 910 starts from the initial value that is used for the output signal phase adjustments.

In some embodiments, the dithering circuit 916 is based on a value (e.g., a scaler multiple of) generated by a pseudo-random generator (PRS) circuit to reduce the quantization error impact and improve the output signal purity. The dithering circuit 916 can further sum the output of the phase accumulator circuit 910 with some random number that is updated each clock cycle.

In some embodiments, the phase-to-amplitude circuit 918 includes a waveform look-up-table (LUT), which performs conversion of the linearly changing phase to the pre-programmed waveform (e.g., sinusoidal or rectified sinusoidal). In some embodiments, the window generator 922 and a window multiplier 923 form the windowing profile, e.g., by using the Tukey window. It can be understood to provide the waveform envelope for the signal being generated, e.g., a type of TX scanning burst.

In some embodiments, the multi-level sigma-delta modulator 932 converts the input LUT numerical data stream to the density-modulated stream. Generally speaking, the multi-level sigma-delta modulator 932 converts the higher-resolution input stream (e.g., 9 bits) from the LUT to the lower resolution output data stream (e.g., of 2 bits), enabling reducing the resolution of the output DAC and overall analog cost reduction.

In some embodiments, the encoder 935 performs the sigma-delta modulator value conversion to the output code where a number of logic ones correspond to the input code value, as shown in the example of Table 1 below.

TABLE 1

| Encoder input | Encoder Output |
| --- | --- |
| 0 | 000 |
| 1 | 001 |
| 2 | 011 |
| 3 | 111 |

The encoder 935 can thus enable using the simplest, single-resistor value, summing digital-to-analog conversion (DAC) values (see inset in FIG. 9) where output voltage level is determined by a count of the encoder output signals that have a logical "high" level. The single value resistor string forms the voltage summing circuit and this type of circuit is very inexpensive to design and verify.

In some embodiments, the DEM circuit 938 shuffles the encoder output values in the circular way, such as illustrated in Table 2 only by way of example.

TABLE 2

| DEM Input | DEM Output |
|---|---|
| 001 | 001 |
| 001 | 010 |
| 001 | 100 |
| 001 | 001 |

The DEM circuit 938 enables the removing, within the output signal, unwanted peak spurs in the frequency domain, which is a result of the DAC resistor array components' value mismatches and converts the peaks in the frequency domain to the white noise. The increased white noise in the TX signal has no impact on emissions peak limits. In other words, when the data stream is supplied that resembles periodical sinusoidal signal to the sigma-delta modulator, the input modulator might generate the periodic output data stream. In some embodiments, the periodic output data stream is sent directly to the summing DAC with differential non-linearity (DNL) due to the component mismatches, the DAC resistor array can generate frequency spurs in the output. The DEM circuit shuffles the encoder outputs and thus minimizes impact of this DAC DNL to the output spectrum.

Figure 10:
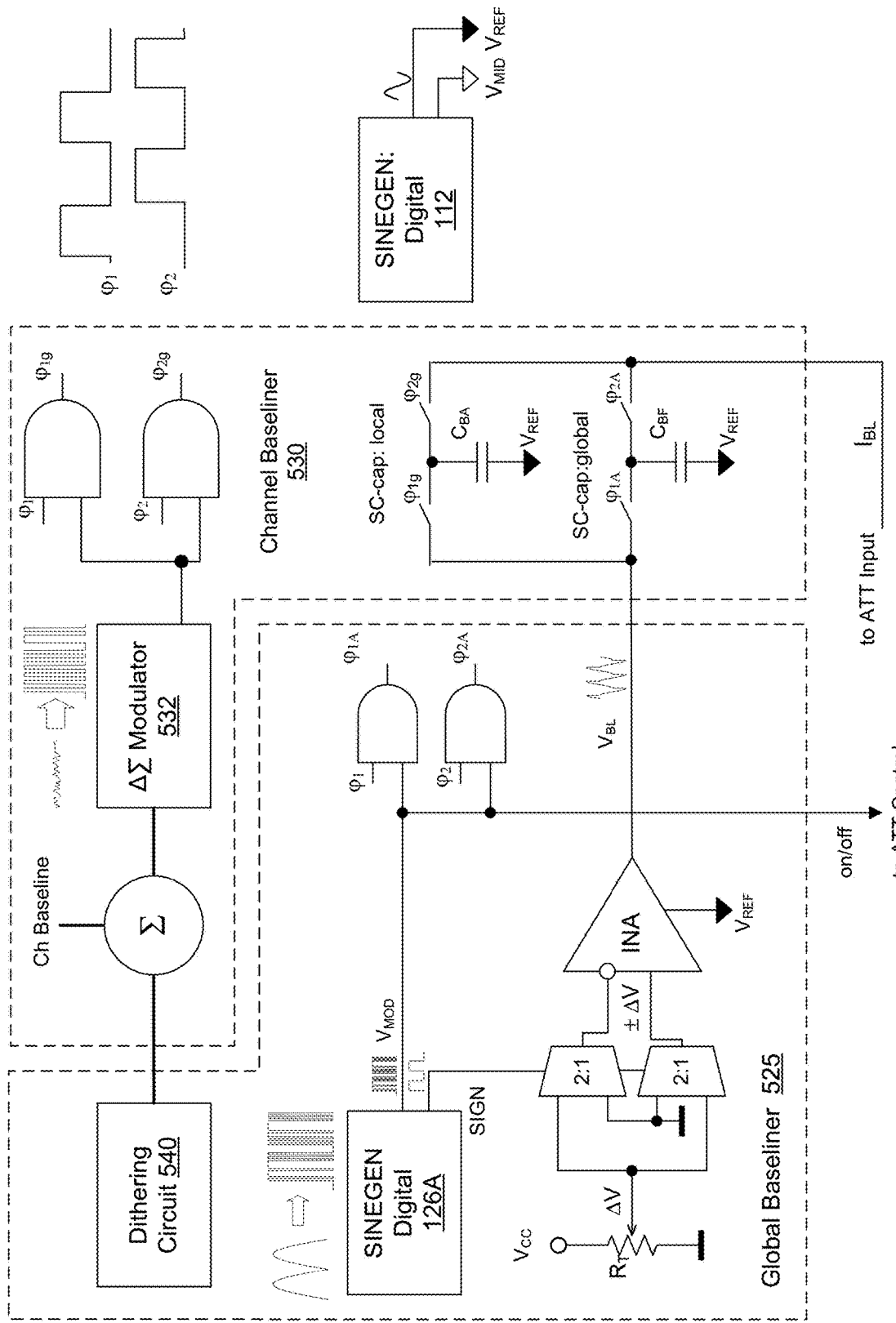
FIG. 10 is a schematic block diagram of a modified sensing channel that employs the two-baseliner circuit of FIGS. 5A-5B according to an embodiment.

FIG. 10 is a schematic block diagram of a modified sensing channel that employs the two-baseliner circuit 500 of FIGS. 5A-5B according to an embodiment. The output current ($I_{BL}$) of the two-baseliner circuit 500 can be sent to the first input (e.g., negative input terminal) of the attenuator 204 and the density-modulated signal ($V_{MOD}$) can be sent to the gain control input of the attenuator 204. The global baseliner 525 enables the sigma-delta modulator (e.g., 932 of FIG. 9) within the signal generator 126A for the attenuator gain control. In some embodiments, the Att Control signal performs a function of the turning on/off the attenuator output current. The baseliner output current can be expressed by Equation (3), where the compensation current is the sum of the sinusoidal current, generated with the help of the global baseliner and rectangular current, which is generated with help of the channel baseliner circuit.

$$I_{BL} = \Delta V \cdot f_{SW} \cdot (C_{BA} d_c + C_{BF} d_g) \quad (3)$$

A similar approach can be used for the multi-level attenuator control; however, the number of the baseliner switching capacitors can be the same as the number of the attenuator gain control levels. Thus, for example, if there are eight attenuator gain levels (0, 1, . . . , 7), seven global baseliner switching capacitors and one channel capacitor can be integrated into the design of the two-baseliner circuit 500 according to some embodiments.

Figure 11:
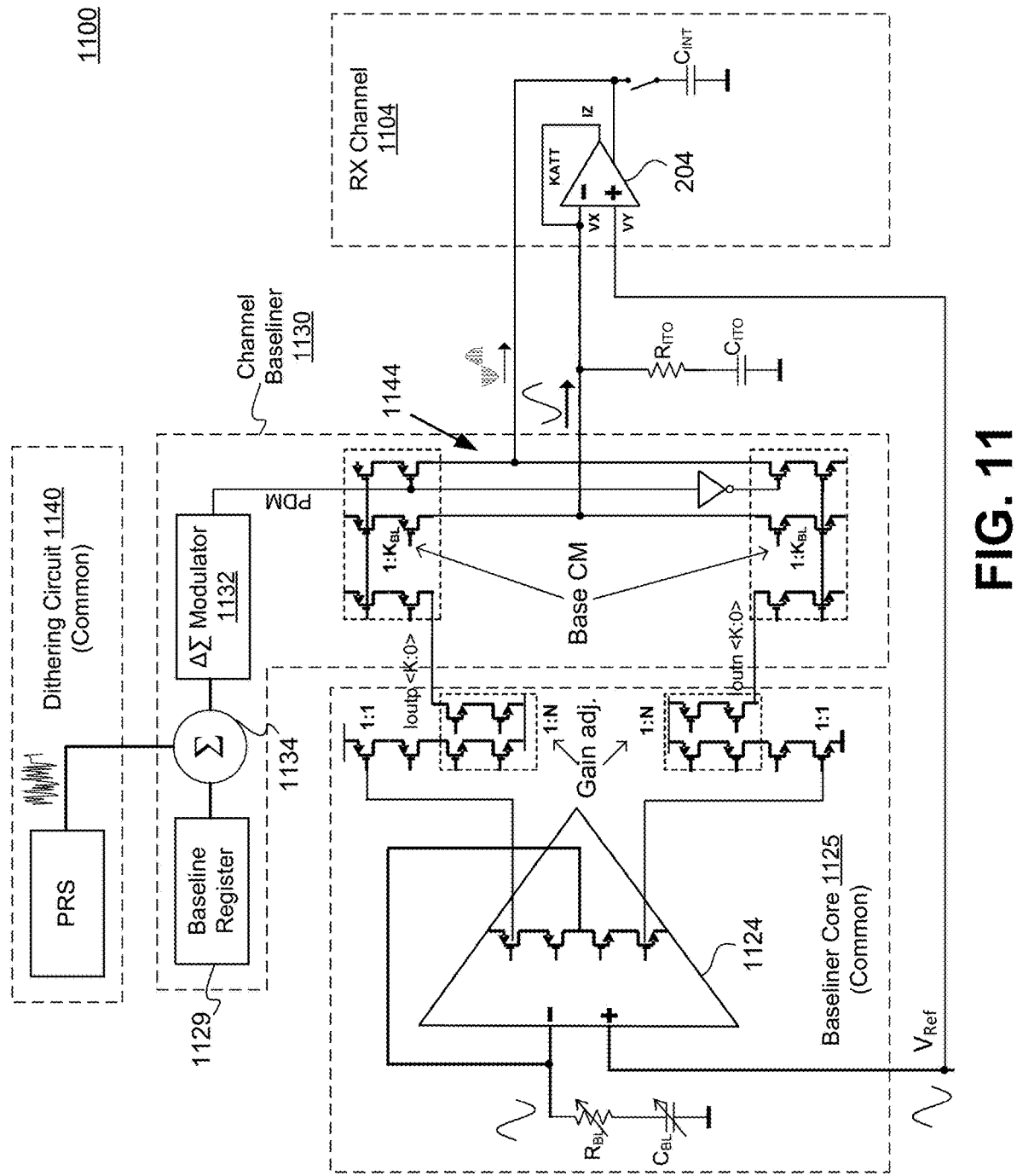
FIG. 11 is a schematic diagram of an alternative baseliner circuit implementation employing a common compensation current reference according to an embodiment.

FIG. 11 is a schematic diagram of an alternative baseliner circuit implementation, e.g., a two-baseliner circuit 1100, employing a common compensation current reference according to an embodiment. The two-baseliner circuit 110 can include a baseliner core circuit 1125, which is similar to the previously discussed global baseliners, a channel baseliner circuit 1130 for each sensing channel, a dithering circuit 1140, which includes a pseudo-random source (PRS), and where each channel baseliner circuit 1130 provides the outputs to be coupled to the attenuator 204 of a sensing channel 1104 of multiple sensing channels.

In various embodiments, the baseliner core circuit 1125 includes an attenuator 1124 (e.g., an operational amplifier in one embodiment), which includes a string of center-tapped transistors (the top transistors being p-type and the bottom transistors being n-type). Feedback from the center of the tapped transistors can be provided back to the first (or negative terminal) input of the attenuation and the reference excitation sinusoidal signal ($V_{REF}$) can be supplied to the second (or positive terminal) input of the attenuator 1124. The baseliner core circuit 1125 can further include optional numbers of transistors that are selectable to provide a common 1:N gain stage, e.g., to fit the sensing device 100 with various parasitic capacitances (or other electrical phenomena).

In various embodiments, the channel baseliner circuit 1130 includes a baseline register 1129, which has a value programmable by the control logic to set an average density of an output bit stream of a sigma-delta modulator 1132. In one embodiment, this value is a channel baseliner amplitude value, discussed previously. As before, the dithering circuit 1140 can inject a pseudo-random value into the value from the baseliner register 1129, e.g., by the summer 1134, before being input into the sigma-delta modulator 1132. A "dither" is an intentionally applied form of noise used to randomize quantization error which, in this case, works to break periodic modes in the sigma-delta modulator 1132 and reduces potential emission via a sensing panel or other sensor having sensing electrodes. Providing a common dithering circuit 1140 enables sharing this additional component resource across sensing channels 1104.

In some embodiments, the channel baseliner circuit 1130 further includes a number of parallel-connected current mirrors 1144, which are selectively enabled by the output of the sigma-delta modulator 1132. These current mirrors can translate the current coming from the baseliner core circuit 1125 (e.g., the core current output) and integrate into the core current fine current adjustments for individual channel compensation tuning. Depending on the implementation, the current from the gated current mirror can go to the integration capacitor directly as shown in FIG. 11 or to the VX terminal of the attenuator, so currents from all current mirrors can be summed together in one point.

Figure 12B:
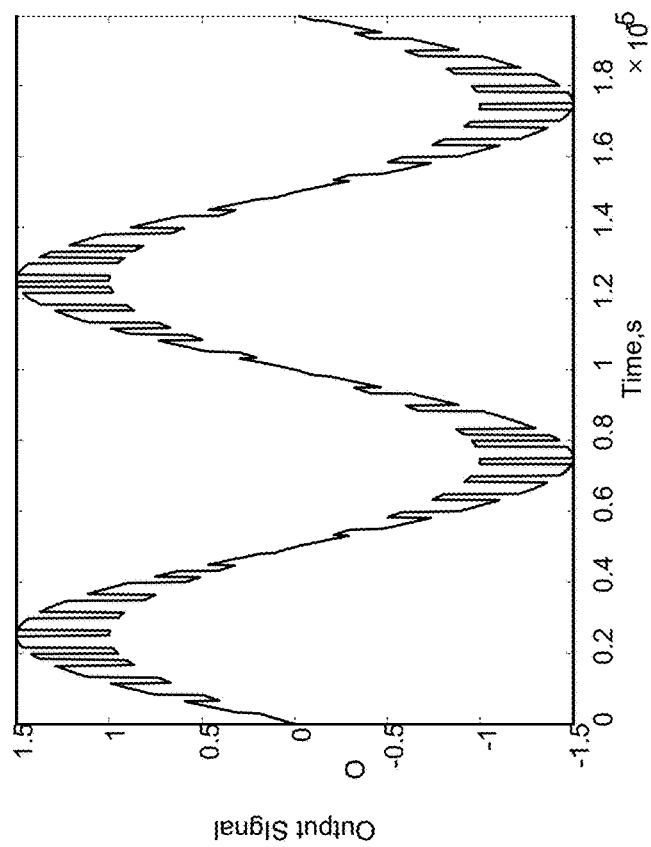
FIG. 12A-12B are a set of graphs illustrating examples of baseliner compensation current waveforms according to some embodiments.
Figure 12A:
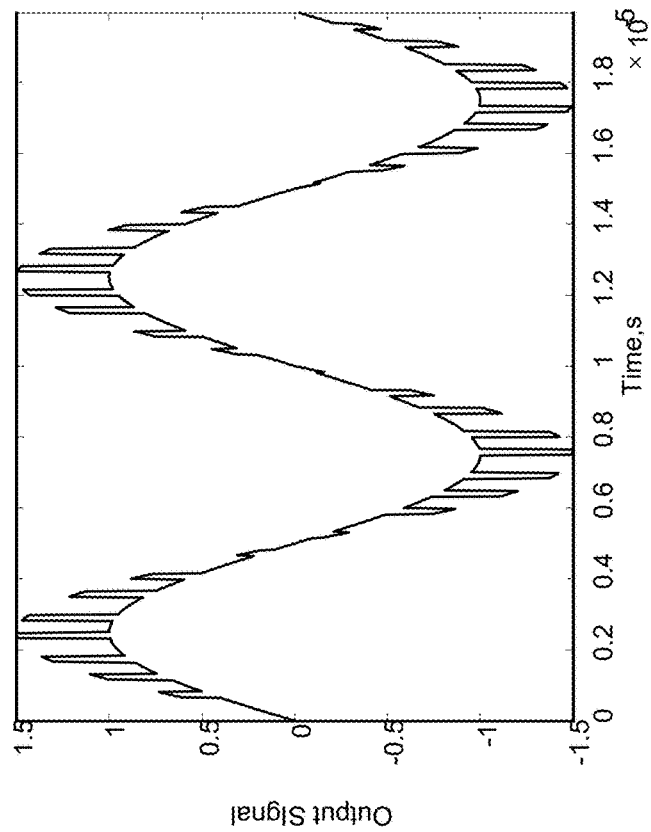

FIG. 12A-12B are a set of graphs illustrating examples of baseliner compensation current waveforms according to some embodiments. For example, the graph of FIG. 12A illustrates a compensation current waveform using a 0.25 duty cycle for driving the sigma-delta modulator 1132 and the graph of FIG. 12B illustrates a compensation current waveform using a 0.75 duty cycle driving the sigma-delta modulator 1132. These graphs represent the implementation when all outputs from the current mirrors go to the VX terminal of the attenuator directly. FIG. 12A and FIG. 12B illustrate that the two-baseliner circuit 1100 can output the sum the sinusoidal compensation current and the density modulated (gated) sinusoidal current, formed by driving the $R_{BL}$ and $C_{BL}$ network using the excitation voltage $V_{REF}$.

FIG. 13 is a schematic block diagram of an alternative two-baseliner circuit 1300 adapted to inject compensation current directly into integration capacitors of the sensing channel according to an embodiment. While previously the output compensation current for a two-baseliner circuit was injected into the input of the attenuator 204, the embodiment of FIG. 13 includes injecting the output compensation current into the integration capacitors ($C_{INT1}$ and $C_{INT2}$) of the sensing channel 104. A global baseliner circuit 1325 of this embodiment does not generate the compensation current, but instead employs the signal generator to generate a density-modulated bit stream that generates, via a first pair of AND gates and a first pair of multiplexers chained together, a first pair of density-modulated clock signals ($\varphi_{1as}$, $\varphi_{2as}$), and that also generates a square wave. The square wave can control a second pair of multiplexers of a channel baseliner circuit 1330 specific to each sensing channel. The sigma-delta modulator of the channel baseliner circuit 1330 can generate a density-modulated bit stream (as before), which is input into a second pair of AND gates. Outputs from the second pair of AND gates feed these multiplexers in order to generate a second pair of density-modulated clock signals ($\varphi_{1gs}$, $\varphi_{2gs}$).

None-overlapping-phase clock signals and the first pair of density-modulated clock signals can be employed to provide switched control of switches of a first floating switched capacitor 1306A, e.g., associated with the global baseliner circuit 1325). None-overlapping-phase clock signals and the second pair of density-modulated clock signals can be employed to provide switched control of switches of a second floating switched capacitor 1306B, e.g., associated with the channel baseliner circuit 1330. Thus, there are two alternating polarity switching capacitor current sources for the channel baseliner circuit 1330 (built with help of $C_{BA}$) and the global baseliner circuit 1325 (built with help of $C_{BF}$). The compensation current polarity change happens due to the swapping of the switching capacitor operation phases $\varphi_{1gs}$ with $\varphi_{2gs}$, and $\varphi_{1as}$ with $\varphi_{2as}$. It is also possible to swap just $\varphi_1$ with $\varphi_2$ to change the polarity of the compensation current.

Figure 14:
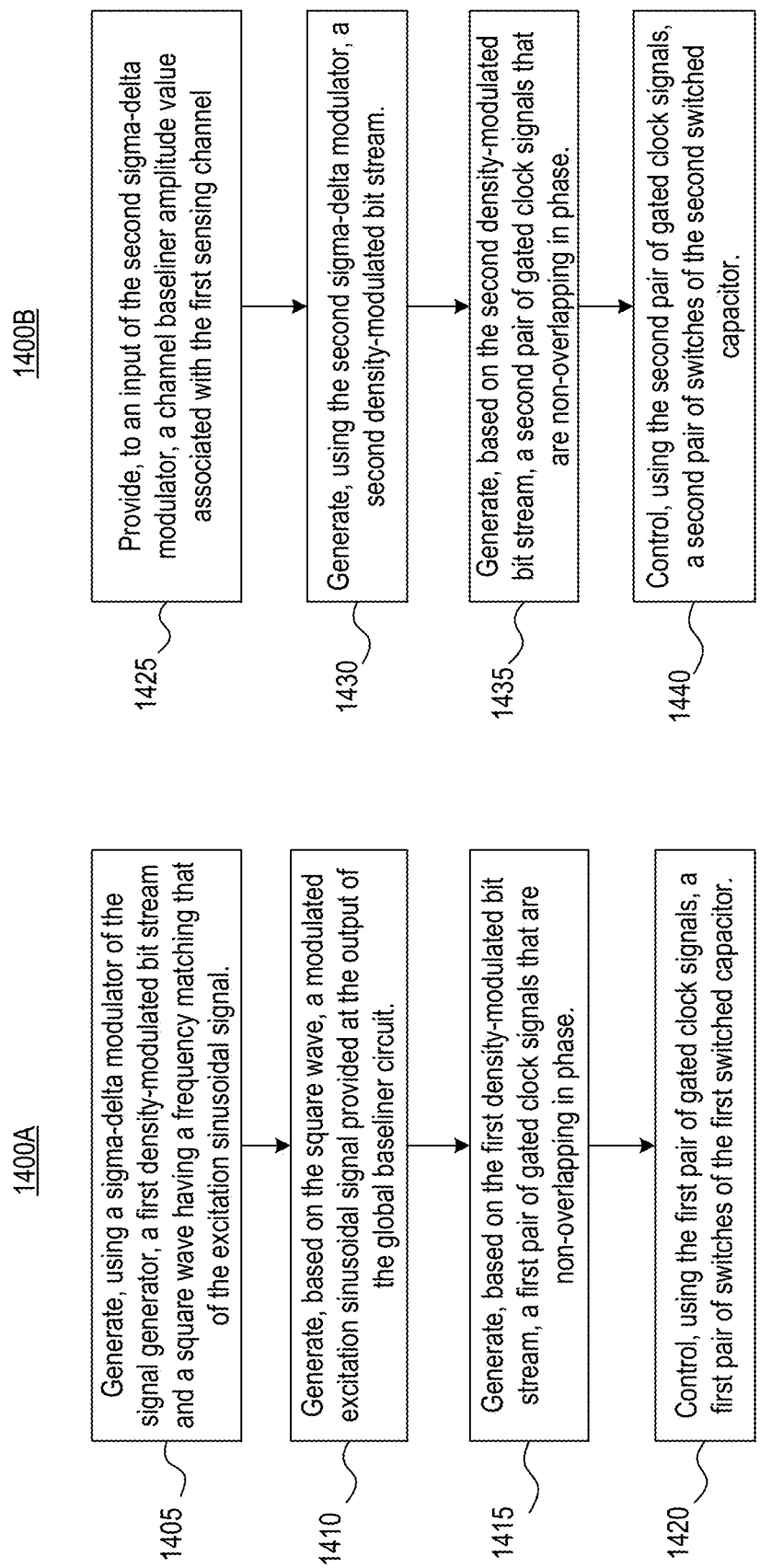
FIG. 14A is a flow diagram of a method for generating baseline compensation current by a simplified two-baseliner circuit (FIG. 7) according to an embodiment.
FIG. 14B is a flow diagram of a method that builds on the method of FIG. 17A for generating more channel-specific compensation current by an expanded two-baseliner circuit (FIG. 5A) according to an embodiment.

FIG. 14A is a flow diagram of a method 1400A for generating baseline compensation current by a simplified two-baseliner circuit (FIG. 7) according to an embodiment. The method 1400A can be performed at least in part by processing logic that includes hardware (e.g., circuitry, dedicated logic, programmable logic, microcode, etc.), firmware, or a combination thereof. In one example embodiment, the method 1400A is performed by control logic or firmware of the disclosed baseliner circuitry. Although illustrated in a particular order, the operations of the method 1400A need not be performed in a particular order unless expressly or inherited described in a certain order.

At operation 1405, the method 1400A includes generating, using a sigma-delta modulator of the signal generator, a first density-modulated bit stream and a square wave having a frequency matching that of the excitation sinusoidal signal.

At operation 1410, the method 1400A includes generating, based on the square wave, a modulated excitation sinusoidal signal provided at the output of the global baseliner circuit.

At operation 1415, the method 1400A includes generating, based on the first density-modulated bit stream, a first pair of gated clock signals that are non-overlapping in phase.

At operation 1420, the method 1400A includes controlling, using the first pair of gated clock signals, a first pair of switches of the first switched capacitor.

FIG. 14B is a flow diagram of a method 1400B that builds on the method of FIG. 17A for generating more channel-specific compensation current by an expanded two-baseliner circuit (FIG. 5A) according to an embodiment. The method 1400B can be performed at least in part by processing logic that includes hardware (e.g., circuitry, dedicated logic, programmable logic, microcode, etc.), firmware, or a combination thereof. In one example embodiment, the method 1400B is performed by control logic or firmware of the disclosed baseliner circuitry. Although illustrated in a particular order, the operations of the method 1400B need not be performed in a particular order unless expressly or inherited described in a certain order.

At operation 1425, the method 1400B includes providing, to an input of the second sigma-delta modulator of the channel baseliner circuit, a channel baseliner amplitude value associated with the first sensing channel.

At operation 1430, the method 1400B includes generating, using the second sigma-delta modulator, a second density-modulated bit stream.

At operation 1435, the method 1400B includes generating, based on the second density-modulated bit stream, a second pair of gated clock signals that are non-overlapping in phase.

At operation 1440, the method 1400B includes controlling, using the second pair of gated clock signals, a second pair of switches of the second switched capacitor.

Figure 15:
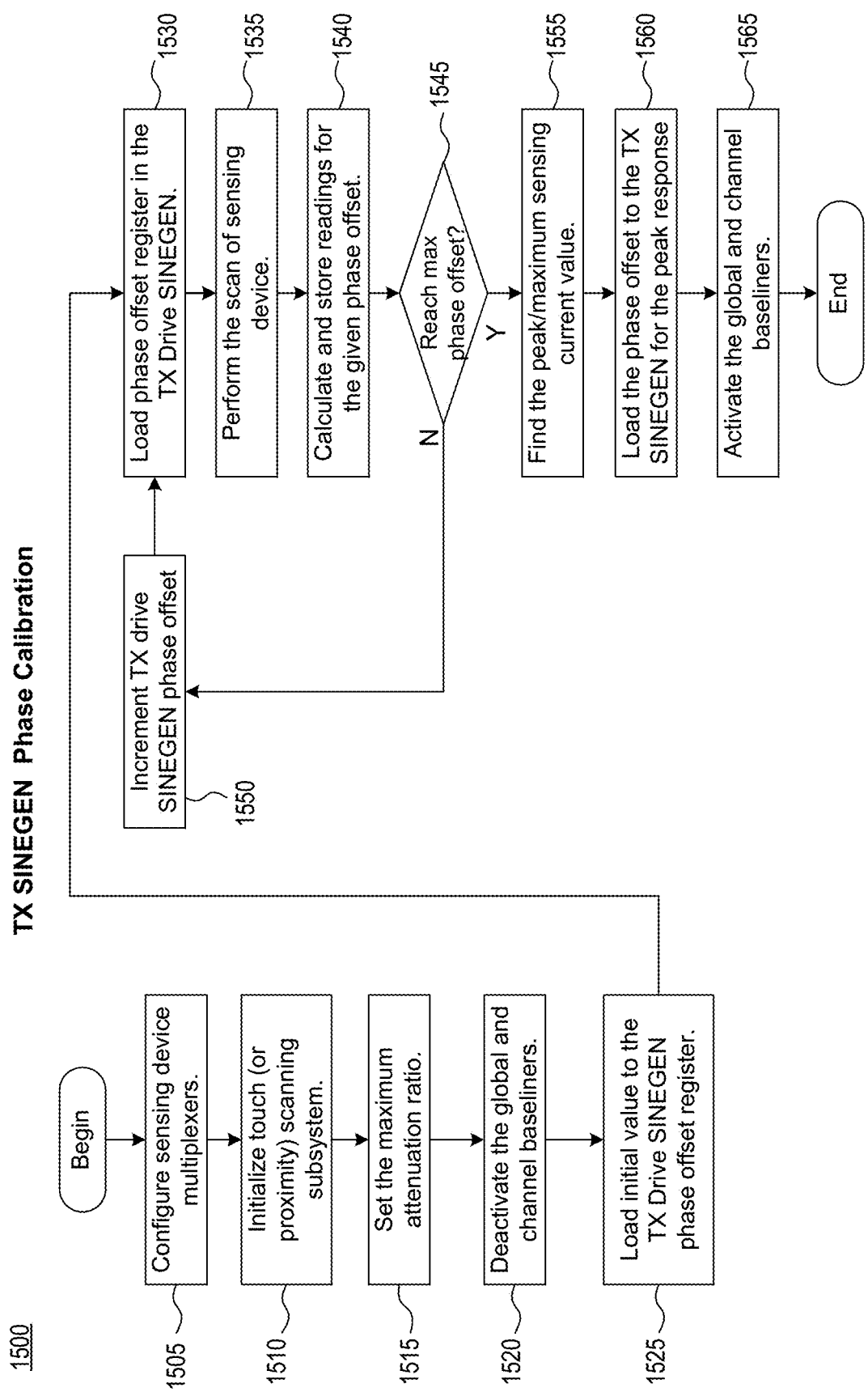
FIG. 15 is a flow diagram of a method for performing phase calibration on a transmitter signal generator according to various embodiments.

FIG. 15 is a flow diagram of a method 1500 for performing phase calibration on a transmitter signal generator according to various embodiments. The method 1500 can be performed at least in part by processing logic that includes hardware (e.g., circuitry, dedicated logic, programmable logic, microcode, etc.), firmware, or a combination thereof. In one example embodiment, the method 1500 is performed by control logic or firmware of the disclosed baseliner circuitry, which may be included within the processing unit 108. Although illustrated in a particular order, the operations of the method 1500 need not be performed in a particular order unless expressly or inherited described in a certain order.

In some embodiments, the method 1500 is employed for at least two reasons. First, to obtain maximum sensitivity of the sensing channel, as the sensing channel expects the input current according to the internal demodulation signals, so the sensing channel is phase sensitive and actual phase offset introduced by the touch panel is not known. Second, in eliminating need for the compensation current phase adjustment, as channel signal input phase is known once the method 1500 completes. In other words, the baseliner circuit can set to zero a phase in the compensation source (the baseliner output signal phase is known by design) and need adjust the compensation only with respect to amplitude.

With reference to the method 1500, in some embodiments, the phase calibration performs alignment of the phase for the sinusoidal excitation signal (the TX drive source or $V_{REF}$ signal, sensing mode dependent) with sensing channel input current demodulation phases. The calibration routine of the method 1500 generally follows the following, including deactivating the baseliner circuits, setting the maximum attenuation ratio to prevent sensing channel saturation, and then repeats in a loop through multiple scan cycles with different phase offsets to find the phase offset that reaches the peak channel current readings. This means panel sensing current is phase aligned with sensing channel demodulation phases and the sensing device will have a largest sensitivity.

At operation 1505, the processing logic configures sensing device multiplexers, e.g., those of the multiplexer 120 and/or other multiplexers in the sensing device.

At operation 1510, the processing logic initializes a touch (or proximity) scanning sub-system, such as the circuits and control logic associated with touch or proximity sensing and control.

At operation 1515, the processing logic sets attenuators of the multiple sensing channels to a maximum attenuation ratio to prevent saturation of the multiple sensing channels.

At operation 1520, the processing logic deactivates (e.g., turns off) the global baseliner circuit(s) and the channel baseliner circuits(s).

At operation 1525, the processing logic loads an initial phase value for the transmitter signal generator 112 into the phase offset register 212. This phase offset register 212 can exist in other transmitter signal generators (SINEGEN TX DRIVE) discussed throughout this disclosure even if not illustrated.

At operation 1530, the processing logic loads the phase offset register with the initial phase offset value.

At operation 1535, the processing logic performs a current sense scan of the sensing device, e.g., a scan of multiple transmit and receive electrodes of the sensing device 100 and reading the current in the sensing channels 104.

At operation 1540, the processing logic calculates and stores the current readings for the given phase offset.

At operation 1545, the processing logic determines whether the current scanning of the sensing electrodes has reached a maximum phase offset value, e.g., between the phase of the activation sinusoidal signal and the sensed current in the sensing channels. In some embodiments, the phase of the sensed current in the sensing channels is averaged over multiple sensing channels.

At operation 1550, in response to not reaching the maximum offset value, the processing logic increments the phase offset value for the transmitter signal generator 112. The phase offset value can continue to be incremented before iteratively performing operations 1530 to 1545 each time until, at operation 1545, the processing logic detects reaching a maximum phase value. This maximum phase value can be determined after a predetermined number of iterations, for example, in which the phase value does not exceed the maximum.

At operation 1555, the processing logic determines the peak (or maximum) value for the sensing current.

At operation 1560, the processing logic loads the phase offset value to the phase offset register 212 of the signal transmitter generator 112 associated with the peak or maximum sensing current response to the current sense scan.

At operation 1565, the processing logic activates the global baseliner circuit and the channel baseliner circuit(s), to enter an operational mode.

FIG. 16 is a flow diagram of a method 1600 for performing calibration of the global baseliner circuits disclosed herein according to various embodiments. The method 1600 can be performed at least in part by processing logic that includes hardware (e.g., circuitry, dedicated logic, programmable logic, microcode, etc.), firmware, or a combination thereof. In one example embodiment, the method 1600 is performed by control logic or firmware of the disclosed baseliner circuitry, which may be included within the processing unit 108. Although illustrated in a particular order, the operations of the method 1600 need not be performed in a particular order unless expressly or inherited described in a certain order.

At operation 1605, the processing logic configures sensing device multiplexers, e.g., those of the multiplexer 120 and/or other multiplexers in the sensing device.

At operation 1610, the processing logic initializes a touch (or proximity) scanning sub-system, such as the circuits and control logic associated with touch or proximity sensing and control.

At operation 1615, the processing logic sets the attenuators of the multiple sensing channels to a maximum attenuation ratio (such as 24X, for example).

At operation 1620, the processing logic deactivates (e.g., turns off) the global baseliner circuit(s) and the channel baseliner circuits(s).

At operation 1625, the processing logic performs a current sense scan of the sensing device 100 while the global baseliner circuit and the channel baseliner circuit(s) are inactivated.

At operation 1630, the processing logic calculates an initial global baseliner amplitude value.

At operation 1635, the processing logic sets a phase of current compensation of the global baseliner circuit and the channel baseliner circuit to zero.

At operation 1640, the processing logic activates the global baseliner circuit and programs the global baseliner circuit with the initial global baseliner amplitude value. The channel baseliner is kept off during FIG. 16 calibration procedure execution.

At operation 1645, the processing logic programs the attenuators of the multiple sensing channels with a normal, predetermined attenuation ratio, such as 6X for example.

At operation 1650, the processing logic performs a current sense scan of the sensing device, e.g., of the multiple transmit and receive sensing electrodes.

At operation 1660, the processing logic determines whether the current sense readings are within minimum and maximum limits, which can also be predetermined.

At operation 1665, the processing device fine-tunes (e.g., adjusts) the global baseliner amplitude value in response to the current sense reading not falling within the minimum and maximum limits, and loops back to perform operations 1640 through 1660 again until a current sensed from the multiple sensing channels falls within minimum and maximum values during one of the current sense scans. Thus, the processing device iteratively causes a current sense scan to be performed on the sensing device under a predetermined attenuation ratio of the attenuators.

At operation 1640, the processing logic programs the global baseliner circuit with the global baseliner amplitude value during each iteration, which value will be used by the global baseliner circuit upon the method 1600 exiting.

Figure 17:
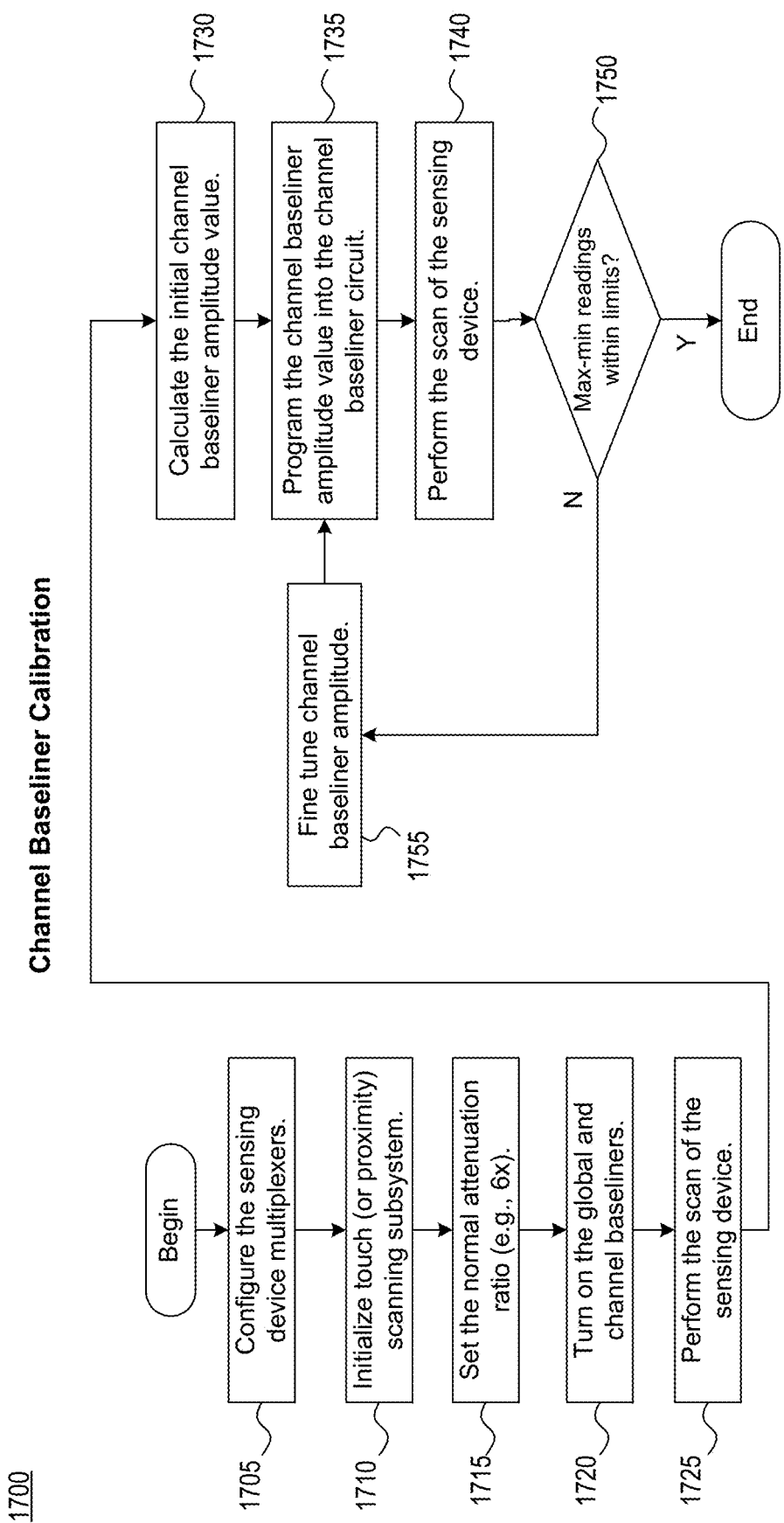
FIG. 17 is a flow diagram of a method for performing calibration of channel baseliner circuits disclosed herein according to various embodiments.

FIG. 17 is a flow diagram of a method 1700 for performing calibration of channel baseliner circuits disclosed herein according to various embodiments. The method 1700 can be performed at least in part by processing logic that includes hardware (e.g., circuitry, dedicated logic, programmable logic, microcode, etc.), firmware, or a combination thereof. In one example embodiment, the method 1700 is performed by control logic or firmware of the disclosed baseliner circuitry, which may be included within the processing unit 108. Although illustrated in a particular order, the operations of the method 1700 need not be performed in a particular order unless expressly or inherited described in a certain order.

At operation 1705, the processing logic configures sensing device multiplexers, e.g., those of the multiplexer 120 and/or other multiplexers in the sensing device.

At operation 1710, the processing logic initializes a touch (or proximity) scanning sub-system, such as the circuits and control logic associated with touch or proximity sensing and control.

At operation 1715, the processing logic set the attenuator of the multiple sensing channels to a normal, e.g., predetermined attenuation ratio, such as 6X for example.

At operation 1720, the processing logic turns on (activates) the global baseliner circuit and the channel baseliner circuit.

At operation 1725, the processing logic performs a current sense scan of the sensing device, e.g., of the multiple transmit and receive sensing electrodes.

At operation 1730, the processing logic calculates an initial channel baseliner amplitude value.

At operation 1735, the processing logic program the channel baseliner amplitude value into the channel baseliner circuit, e.g., into a register of the channel baseliner circuit.

At operation 1740, the processing logic again performs a current sense scan of the sensing device.

At operation 1750, the processing logic determines whether the current sense readings are within minimum and maximum limits, which can also be predetermined.

At operation 1755, the processing logic fine-tunes (e.g., adjusts) the channel baseliner amplitude value in response to not detecting that the current sense readings are within minimum and maximum limits. After each turning or adjusting at operation 1755, the processing logic can iterate through operations 1735 through 1750 until detecting that the current sense reading is within the minimum and maximum limits.

In this way, the processing logic iteratively causes a current sense scan to be performed on the sensing device under a pre-determined attenuation ratio of the attenuator of each sensing channel. The processing logic further adjusts the channel baseliner amplitude value for the first sensing channel until a current of the first sensing channel falls within minimum and maximum values during one of the current sense scans. The processing logic further programs the channel baseliner circuit with the channel baseliner amplitude value that has been adjusted.

The calibration procedures of FIGS. 15-17 can be executed in series, first by performing the TX source phase calibration per FIG. 15. Later, the global baseliner calibration can be performed per method shown in FIG. 16. Ultimately, the channel baseliners can be calibrated per method shown in FIG. 17. Depending the baseliner embodiments, global and/or channel baseliner calibration procedures might not be needed.

The calibration procedures of FIGS. 15-17 may take a few iterations to fit the designed limits, for the fast convergence the processing unit 108 can use linear interpolation between two baseliner/scan results taking into account channel readings are linear versus compensation amplitude. In some embodiments, as the sensing device has distributed capacitance/resistance in the sensing electrodes, resulting in variation of the sensing channel-to-channel input current phase, some advanced implementations cause individual phase adjustments within each channel baseliner in the addition to the amplitude adjustments for each sensing channel.

In the above description, some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "communicating," "modifying," "measuring," "determining," "sending," "comparing," "maintaining," "switching," "controlling," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example' or "exemplary" is not necessarily to be construed as preferred or advantageous over other aspects or designs. Rather, the use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An apparatus comprising:
  a global baseliner circuit coupled with a plurality of sensing channels of a sensing device, the global baseliner circuit comprising a signal generator to generate a rectified sinusoidal signal and a square wave having a frequency matching that of an excitation sinusoidal signal used to excite sensing electrodes of the sensing device, the global baseliner circuit to use the square wave to modulate the excitation sinusoidal signal provided at an output of the global baseliner circuit; and
  a channel baseliner circuit coupled between the global baseliner circuit and a sensing channel of the plurality of sensing channels, the channel baseliner circuit comprising:
    a switched capacitor coupled between the output of the global baseliner circuit and the sensing channel;

a sigma-delta modulator coupled with the signal generator and to generate, from the rectified sinusoidal signal, a density-modulated bit stream; and a pair of gates to use the density-modulated bit stream and non-overlapping-phase clock signals to generate outputs comprising density-modulated clock signals sent to switches of the switched capacitor.

2. The apparatus of claim 1, wherein the pair of gates comprises:

a first AND gate to receive inputs comprising a first clock signal, of the non-overlapping-phase clock signals, and the density-modulated bit stream and to output a first density-modulated clock signal to a first switch of the switched capacitor; and a second AND gate to receive inputs comprising a second clock signal, of the non-overlapping-phase clock signals, and the density-modulated bit stream and to output a second density-modulated clock signal to a second switch of the switched capacitor.

3. The apparatus of claim 1, wherein the global baseliner circuit further comprises a mixer coupled between the signal generator and the switched capacitor, the mixer to:

generate an amplitude-adjusted rectangular signal via use of the square wave to alter a sign of a global baseliner amplitude value; and combine the excitation sinusoidal signal with the amplitude-adjusted rectangular signal to provide a coarse adjustment to a modulated excitation sinusoidal signal.

4. The apparatus of claim 1, further comprising control logic to variably adjust one of a threshold or a full-scale range of the sigma-delta modulator, based on a calibration of the channel baseliner circuit, to fine-tune values of the density-modulated bit stream.

5. A system comprising:

a plurality of sensing channels that are coupled with sensing electrodes of a sensing device, wherein a first sensing channel of the plurality of sensing channels comprises an attenuator having a first input coupled with at least one of the sensing electrodes and a second input to receive an excitation sinusoidal signal used to excite the sensing electrodes;

a global baseliner circuit comprising a signal generator to generate a first density-modulated bit stream and a square wave having a frequency matching that of the excitation sinusoidal signal, the global baseliner circuit to use the square wave to modulate the excitation sinusoidal signal provided at an output of the global baseliner circuit; and a channel baseliner circuit operatively coupled with the global baseliner circuit and the at least one of the sensing electrodes, the channel baseliner circuit comprising:

a sigma-delta modulator to receive, as input, a channel baseliner amplitude value associated with the first sensing channel and to generate a second density-modulated bit stream;

a first switched capacitor coupled between the output of the global baseliner circuit and the first input of the attenuator, the first switched capacitor having a first pair of switches controlled by a first pair of gated clock signals generated by the first density-modulated bit stream; and a second switched capacitor coupled in parallel with the first switched capacitor, the second switched capacitor having a second pair of switches controlled by a second pair of gated clock signals generated by the second density-modulated bit stream.

6. The system of claim 5, wherein the global baseliner circuit further comprises:

a first AND gate to receive inputs comprising a first clock signal and the first density-modulated bit stream and to output a first density-modulated clock signal to a first switch of the first pair of switches; and a second AND gate to receive inputs comprising a second clock signal and the first density-modulated bit stream and to output a second density-modulated clock signal to a second switch of the first pair of switches, wherein phases of the first clock signal and the second clock signal are non-overlapping.

7. The system of claim 5, wherein the channel baseliner circuit further comprises a first AND gate to receive inputs comprising a first clock signal and the second density-modulated bit stream and to output a first density-modulated clock signal to a first switch of the second pair of switches; and a second AND gate to receive inputs comprising a second clock signal and the second density-modulated bit stream and to output a second density-modulated clock signal to a second switch of the second pair of switches, wherein phases of the first clock signal and the second clock signal are non-overlapping.

8. The system of claim 5, wherein the global baseliner further comprises a dithering circuit and the channel baseliner further comprises a summer to combine a pseudo-random signal from the dithering circuit with the channel baseliner amplitude value.

9. The system of claim 5, further comprising control logic to, while the channel baseliner circuit is activated:

iteratively cause a current sense scan to be performed on the sensing device under a predetermined attenuation ratio of the attenuator of the first sensing channel;

adjust the channel baseliner amplitude value for the sensing channel until a current of the first sensing channel falls within minimum and maximum values during one of the current sense scans; and program the channel baseliner circuit with the channel baseliner amplitude value that has been adjusted.

10. The system of claim 5, wherein the global baseliner circuit further comprises a mixer coupled between the signal generator and the first switched capacitor, the mixer to combine the excitation sinusoidal signal with an amplitude-adjusted rectangular signal that inverts and provides a coarse adjustment to the excitation sinusoidal signal.

11. The system of claim 10, wherein the mixer comprises:

a variable resistor coupled between a supply voltage and ground, wherein a tap point of the variable resistor is adjustable using a global baseliner amplitude value determined during calibration of the global baseliner circuit;

a pair of multiplexers selectively controlled by the square wave to set a sign of a voltage from the variable resistor as inverse to that of the square wave and output the amplitude-adjusted rectangular signal; and an instrumentation amplifier to sum the excitation sinusoidal signal with the amplitude-adjusted rectangular signal.

12. The system of claim 5, wherein the signal generator is adapted with direct digital synthesis and comprises a second sigma-delta modulator to generate the second density-modulated bit stream.

13. The system of claim 5, further comprising:
a transmitter signal generator to generate the excitation sinusoidal signal, the transmitter signal generator comprising a phase offset register to store a phase offset value; and
control logic coupled with the transmitter signal generator, the control logic to:
set attenuators of the plurality of sensing channels to a maximum attenuation ratio to prevent saturation of the plurality of sensing channels;
deactivate the global baseliner circuit and the channel baseliner circuit;
load the phase offset register with an initial phase offset value;
iteratively cause, with increments in the phase offset value during each iteration, a current sense scan to be performed on the sensing device until determining the phase offset value that causes the plurality of sensing channels to sense a maximum current value;
load the phase offset value into the phase offset register; and
activate the global baseliner circuit and the channel baseliner circuit.

14. A method comprising:
operating a sensing device comprising a plurality of sensing channels, which includes a first sensing channel comprising an attenuator having a first input coupled with at least one of a plurality of sensing electrodes and a second input to receive an excitation sinusoidal signal, a global baseliner circuit comprising a signal generator, and a channel baseliner circuit comprising a first switched capacitor coupled between an output of the global baseliner and the first input of the attenuator, wherein operating the sensing device comprises:
generating, using a sigma-delta modulator of the signal generator, a first density-modulated bit stream and a square wave having a frequency matching that of the excitation sinusoidal signal;
generating, based on the square wave, a modulated excitation sinusoidal signal provided at the output of the global baseliner circuit;
generating, based on the first density-modulated bit stream, a first pair of gated clock signals that are non-overlapping in phase; and
controlling, using the first pair of gated clock signals, a first pair of switches of the first switched capacitor.

15. The method of claim 14, wherein the channel baseliner circuit further comprises a second sigma-delta modulator and a second switched capacitor coupled in parallel with the first switched capacitor, and wherein operating the sensing device further comprises:
providing, to an input of the second sigma-delta modulator, a channel baseliner amplitude value associated with the first sensing channel;
generating, using the second sigma-delta modulator, a second density-modulated bit stream;
generating, based on the second density-modulated bit stream, a second pair of gated clock signals that are non-overlapping in phase; and
controlling, using the second pair of gated clock signals, a second pair of switches of the second switched capacitor.

16. The method of claim 15, wherein the global baseliner circuit further comprises a dithering circuit and the channel baseliner further comprises a summer, and wherein operating the sensing device further comprises combining, using the summer, a pseudo-random signal from the dithering circuit with the channel baseliner amplitude value to generate the input to the second sigma-delta modulator.

17. The method of claim 15, wherein operating the sensing device further comprises:
iteratively causing a current sense scan to be performed on the sensing device under a predetermined attenuation ratio of the attenuator of the first sensing channel;
adjusting the channel baseliner amplitude value for the first sensing channel until a current of the first sensing channel falls within minimum and maximum values during one of the current sense scans; and
programming the channel baseliner circuit with the channel baseliner amplitude value that has been adjusted.

18. The method of claim 14, wherein the global baseliner circuit further comprises a mixer coupled between the signal generator and the first switched capacitor, and wherein operating the sensing device comprises:
generating, by the mixer using the square wave and a global baseliner amplitude value, an amplitude-adjusted rectangular signal; and
combining, using the mixer to generate the modulated excitation sinusoidal signal, the excitation sinusoidal signal with the amplitude-adjusted rectangular signal that inverts and provides a coarse adjustment to the excitation sinusoidal signal.

19. The method of claim 18, wherein operating the sensing device further comprises;
setting attenuators of the plurality of sensing channels to a maximum attenuation ratio to prevent saturation of the plurality of sensing channels;
performing a current sense scan of the sensing device while the global baseliner circuit and the channel baseliner circuit are both inactivated;
calculating an initial global baseliner amplitude value;
setting a phase of current compensation of the global baseliner circuit and the channel baseliner circuit to zero;
activating the global baseliner circuit;
programming the global baseliner circuit with the initial global baseliner amplitude value;
iteratively causing a current sense scan to be performed on the sensing device under a predetermined attenuation ratio of the attenuators;
adjusting the global baseliner amplitude value until a current sensed from the plurality of sensing channels falls within minimum and maximum values during one of the current sense scans; and
programming the global baseliner circuit with the global baseliner amplitude value.

20. The method of claim 14, wherein the sensing device further comprises a transmitter signal generator to generate the excitation sinusoidal signal, the transmitter signal generator comprising a phase offset register to store a phase offset value, and wherein operating the sensing device further comprises:
setting attenuators of the plurality of sensing channels to a maximum attenuation ratio to prevent saturation of the plurality of sensing channels;
deactivating the global baseliner circuit and the channel baseliner circuit;
loading the phase offset register with an initial phase offset value;
iteratively causing, with increments in the phase offset value during each iteration, a current sense scan to be performed on the sensing device until determining the phase offset value that causes the plurality of sensing channels to sense a maximum current value;

loading the phase offset value into the phase offset register; and activating the global baseliner circuit and the channel baseliner circuit.

* * * * *